United States Patent
Kobayashi et al.

(10) Patent No.: US 7,118,936 B2
(45) Date of Patent: Oct. 10, 2006

(54) ORGANIC DYE-SENSITIZED METAL OXIDE SEMICONDUCTOR ELECTRODE AND ITS MANUFACTURING METHOD, AND ORGANIC DYE-SENSITIZED SOLAR CELL

(75) Inventors: Taichi Kobayashi, Kodaira (JP); Masato Yoshikawa, Kodaira (JP); Yoshinori Iwabuchi, Kodaira (JP); Itsuo Tanuma, Kodaira (JP); Shingo Oono, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 196 days.

(21) Appl. No.: 10/492,162

(22) PCT Filed: Oct. 11, 2002

(86) PCT No.: PCT/JP02/10602

§ 371 (c)(1),
(2), (4) Date: Apr. 9, 2004

(87) PCT Pub. No.: WO03/034533

PCT Pub. Date: Apr. 24, 2003

(65) Prior Publication Data

US 2004/0248394 A1    Dec. 9, 2004

(30) Foreign Application Priority Data

| Oct. 11, 2001 | (JP) | ............................. 2001-314332 |
| Oct. 11, 2001 | (JP) | ............................. 2001-314333 |
| Oct. 11, 2001 | (JP) | ............................. 2001-314334 |
| Oct. 19, 2001 | (JP) | ............................. 2001-322311 |
| Oct. 19, 2001 | (JP) | ............................. 2001-322314 |
| Oct. 19, 2001 | (JP) | ............................. 2001-322315 |
| Oct. 31, 2001 | (JP) | ............................. 2001-335060 |

(51) Int. Cl.
*H01L 51/40* (2006.01)
*H01L 21/00* (2006.01)
*H01L 29/08* (2006.01)

(52) U.S. Cl. ........................ 438/99; 438/104; 257/40; 257/43

(58) Field of Classification Search ................ 438/99, 438/104; 257/40, 43
See application file for complete search history.

(56) References Cited

U.S. PATENT DOCUMENTS

| 6,043,428 A | 3/2000 | Han et al. |
| 6,130,378 A | 10/2000 | Hatano et al. |
| 6,538,194 B1 * | 3/2003 | Koyanagi et al. ........... 136/256 |

FOREIGN PATENT DOCUMENTS

| JP | 04-363810 A | 12/1992 |
| JP | 06-212421 A | 8/1994 |

(Continued)

OTHER PUBLICATIONS

Hyomen Gijutu Binran, Nikkan Kogyo Shinbunsha, Feb. 27, 1998, pp. 774-780.

(Continued)

*Primary Examiner*—Scott B. Geyer
(74) *Attorney, Agent, or Firm*—Sughrue Mion, PLLC

(57) ABSTRACT

The present invention provides a semiconductor electrode of organic dye-sensitized metal oxide having a semiconductor layer of metal oxide that can be easily prepared, and an organic dye-sensitized solar cell. The semiconductor electrode of organic dye-sensitized metal oxide comprises a substrate having a transparent electrode thereon, a semiconductor layer of metal oxide provided on the electrode and an organic dye absorbed on a surface of the semiconductor layer, the semiconductor layer being formed by a vapor deposition process.

19 Claims, 5 Drawing Sheets

FOREIGN PATENT DOCUMENTS

| | | |
|---|---|---|
| JP | 07-034241 A | 2/1995 |
| JP | 10-255863 A | 9/1998 |
| JP | 11-29860 A | 2/1999 |
| JP | 11-74003 A | 3/1999 |
| JP | 11-219734 A | 8/1999 |
| JP | 11-229131 A | 8/1999 |
| JP | 11-273753 A | 10/1999 |
| JP | 11-312541 A | 11/1999 |
| JP | 2000-36330 A | 2/2000 |
| JP | 2000-133828 A | 5/2000 |
| JP | 2000-216414 A | 8/2000 |
| JP | 2000-231943 A | 8/2000 |
| JP | 2000-243134 A | 9/2000 |
| JP | 2000-268890 A | 9/2000 |
| JP | 2000-285972 A | 10/2000 |
| JP | 2000-319778 A | 11/2000 |
| JP | 2002-75472 A | 3/2002 |
| JP | 2002-170602 A | 6/2002 |
| JP | 2002-280087 A | 9/2002 |

OTHER PUBLICATIONS

Chemical Map Series, Chem. 16, Butsuriteki jyouchaku, Japan Patent Office, Mar. 30, 2000, pp. 276-280.

* cited by examiner

ORGANIC DYE-SENSITIZED METAL OXIDE SEMICONDUCTOR ELECTRODE AND ITS MANUFACTURING METHOD, AND ORGANIC DYE-SENSITIZED SOLAR CELL

BACKGROUND OF INVENTION

1. Field of the Invention

The present invention relates to an organic dye-sensitized solar cell, a semiconductor electrode of organic dye-sensitized metal oxide advantageously used in the solar cell and the process for the preparation thereof.

2. Description of the Related Art

Recently, great attention has been paid to a solar cell that converting directly the sunlight to electrical energy from the standpoints of energy saving, effective utilization of resources and prevention of environmental pollution, and therefore the development of the solar cell has been advanced.

As the solar cell, those utilizing crystalline silicon or amorphous silicon widely employed. However, a large amount of energy is required to form the crystalline silicon or the like and therefore the use of silicon brings about effect contrary to the original object of the solar cell, that is energy saving cell utilizing the sunlight. Further as a result of the consumption of a large amount of energy, the solar cell using the silicon as a photoelectric conversion material becomes expensive.

The photoelectric conversion material converts light energy to electric energy by the electrochemical reaction caused between electrodes. For example, when the photoelectric conversion material is exposed to light, electrons generate on one of the electrodes and the electrons are moved to the electrode couple (the other of the electrodes). The electrons moved to the electrode couple are changed to ions in electrolyte and returned to the former electrode. Thus the photoelectric conversion material enables light energy to be taken out in the form of electric energy and hence can be utilized as the solar cell.

A solar cell using semiconductor of dye-sensitized metal oxide instead of silicon as a photoelectric conversion material is already known. Nature, 268 (1976), page 402 describes a solar cell having a semiconductor electrode of dye-sensitized metal which is prepared by subjecting zinc oxide powder to compression molding, sintering the molded powder at 1,300° C. for one hour to form a disc-shaped sintered product and adsorbing Rose Bengal as an organic dye on the sintered product. In the electric current/voltage curve of this solar cell, the electric current in electromotive voltage of 0.2V is extremely low approx. 25 µA, and therefore it is little possible to put the solar cell to practical use. However, in contrast with the solar cell using silicon, the semiconductor of metal oxide and organic dye used in this solar cell are manufactured in large quantity and the they are relatively at low price. Therefore this solar cell is greatly advantageous in view of the used materials.

As the solar cell using a semiconductor of dye-sensitized metal oxide as a photoelectric conversion material, in addition of the above-mentioned solar cell, there are known the followings: a solar cell having a layer of spectral sensitizing dye such as a transition metal complex provided on a surface of the semiconductor layer of metal oxide, which is described in JP-A-1-220380, and a solar cell having a layer of spectral sensitizing dye such as a transition metal complex provided on a surface of the semiconductor layer of metal ion-doped titanium oxide, which is described in JP-A-5-504023.

The above-mentioned solar cells do not show practically satisfactory electric current/voltage curve. JP-A-10-92477 discloses a solar cell showing practically satisfactory electric current/voltage curve, which has an oxide semiconductor layer comprising the sintered product of the aggregation of fine particles of oxide semiconductor. The layer is formed by applying a slurry of fine particles of oxide semiconductor onto a transparent electrode, drying the slurry film and sintering the dried film at 500° C. for approx. one hour.

SUMMARY OF THE INVENTION

In the solar cell disclosed in JP-A-10-92477, the oxide semiconductor layer comprising the sintered product of the aggregation of fine particles of oxide semiconductor is formed by the "sol-gel" method. The "sol-gel" method needs heating at high temperature for a long-term period after the application and hence also excellent heat resistance of a substrate and transparent electrode. The conventional transparent electrode such as ITO does not have the excellent heat resistance, and therefore it is required to use a transparent electrode of fluorine-doped tin oxide which has excellent heat resistance. However, the fluorine-doped tin oxide has poor electrical conductivity and further is not adequate for a use (e.g., solar cell) requiring a large area.

In view of the above-mentioned problems, the object of the present invention is to provide a semiconductor electrode of organic dye-sensitized metal oxide having a semiconductor layer of metal oxide which can be easily formed at reduced temperature, and an organic dye-sensitized solar cell having the semiconductor electrode of organic dye-sensitized metal oxide.

Further, the object of the present invention is to provide a semiconductor electrode of organic dye-sensitized metal oxide having a semiconductor layer of metal oxide which can be formed at reduced temperature and high rate and which has high conversion efficiency of light energy, and an organic dye-sensitized solar cell having the semiconductor electrode of organic dye-sensitized metal oxide.

Furthermore, the object of the present invention is to provide an organic dye-sensitized solar cell which has excellent adhesion to the transparent electrode, excellent dye-adsorbing property and high efficiency and long usable life, and a semiconductor electrode of organic dye-sensitized metal oxide having a semiconductor layer of metal oxide useful in the solar cell.

Still, the object of the present invention is to provide a process for the preparation of the above-mentioned semiconductor electrode of organic dye-sensitized metal oxides.

As described above, the solar cell disclosed in JP-A-10-92477 has an oxide semiconductor layer comprising the sintered product of the aggregation of fine particles of oxide semiconductor formed by the "sol-gel" method, which is provided on a transparent electrode. Since the practicality of the solar cell depends on the properties of the transparent electrode, ITO is generally used as the transparent electrode due to its low resistivity.

However, even this transparent electrode of ITO does not have sufficiently reduced electrical resistance for a use (e.g., solar cell) requiring a large area. Thus the transparent electrode is required to have further reduced electrical resistance (desirably not more than 10 $\Omega/\square$).

Hence, the object of the present invention is to provide a semiconductor electrode of organic dye-sensitized metal oxide having a transparent electrode which can be easily formed and which has reduced electrical resistance, and an organic dye-sensitized solar cell having the semiconductor electrode of organic dye-sensitized metal oxide.

Further, the object of the present invention is to provide an organic dye-sensitized solar cell having a large area.

As described previously, the solar cell disclosed in JP-A-10-92477 has an oxide semiconductor layer comprising the sintered product of the aggregation of fine particles of oxide semiconductor formed by the "sol-gel" method, which is provided on a transparent electrode. The "sol-gel" method needs the heating at high temperature for a long-term period after the coating, and hence also excellent heat resistance of a substrate and transparent electrode. The conventional transparent electrode such as ITO does not have the excellent heat resistance, and therefore it is required to use a transparent electrode of fluorine-doped tin oxide which has excellent heat resistance. However, the fluorine-doped tin oxide has poor electrical conductivity and hence it is required to form the transparent electrode having increased thickness in order to obtain high electrical conductivity (i.e., low electrical resistance) in a large area (e.g., that of solar cell).

However, the increase of the thickness of the transparent electrode reduces its transparency, and therefore a solar cell having the electrode come to utilize the reduced solar energy.

Hence, the object of the present invention is to provide a semiconductor electrode of organic dye-sensitized metal oxide in which solar energy can be efficiently utilized, and an organic dye-sensitized solar cell having the semiconductor electrode.

The above-mentioned objects are attained by the present invention.

The invention is provided by a semiconductor electrode of organic dye-sensitized metal oxide comprising a substrate having a transparent electrode thereon, a semiconductor layer of metal oxide provided on the electrode and an organic dye absorbed on a surface of the semiconductor layer, wherein the semiconductor layer is formed by a vapor deposition process; and an organic dye-sensitized solar cell comprising the semiconductor electrode of organic dye-sensitized metal oxide as mentioned above, an electrode couple provided opposite the semiconductor electrode, and redox electrolyte injected between the electrode and the electrode couple.

In the semiconductor electrode of organic dye-sensitized metal oxide and organic dye-sensitized solar cell, the vapor deposition process (i.e., vapor thin film deposition process) generally is a physical vapor deposition process, a vacuum deposition process, a sputtering process, an ion plating process, a chemical vapor deposition (CVD) process or a plasma chemical vapor deposition (plasma CVD) process. The sputtering process preferably is a reactive sputtering process.

The sputtering process preferably is an opposite target type diode sputtering process or a dual cathode type magnetron sputtering process. The sputtering processes preferably are a reactive sputtering process. It is preferred that the dual cathode type magnetron sputtering process is a bi-polar type dual magnetron sputtering process or a unipolar type dual magnetron sputtering process.

The semiconductor layer of metal oxide generally comprises titanium oxide, zinc oxide, tin oxide, antimony oxide, niobium oxide, tungsten oxide or indium oxide, or the metal oxide doped by other metal or metal oxide. It is preferred that the semiconductor layer comprises titanium oxide, especially anatase-form titanium oxide. A thickness of the semiconductor layer of metal oxide generally is not less than 10 nm.

In the preferred embodiment of the invention, the semiconductor electrode of organic dye-sensitized metal oxide is formed by the vapor deposition process, and further its surface roughness Ra is not less than 2 nm, the Ra being defined as centerline average height, and its void volume is not less than 25%. The surface roughness Ra preferably is not less than 5 nm, especially not less than 10 nm, and the void volume preferably is not less than 30%, especially not less than 35%. Thereby the amount of adsorption of the organic dye is further increased to enhance the conversion efficiency of light energy.

The semiconductor electrode of organic dye-sensitized metal oxide described previously can be advantageously obtained by a process comprising the steps of:

subjecting a transparent electrode of a substrate having the transparent electrode thereon to a vapor deposition process using a metal and/or metal oxide as a target to form a semiconductor layer of metal oxide, and adsorbing an organic dye on a surface of the semiconductor layer.

In the process, the vapor deposition process preferably is an opposite target type diode sputtering process or a dual cathode type magnetron sputtering process. As a target used in the opposite target type diode sputtering process or dual cathode type magnetron sputtering process, electrically conductive titanium oxide is preferably employed. The opposite target type diode sputtering process or dual cathode type magnetron sputtering process is preferably carried out with flowing oxygen (especially in case of using the electrically conductive titanium oxide). It is preferred that the metal as the target is titanium, zinc, tin, antimony, niobium, tungsten or indium, or a mixture of the metals, and that the metal oxide as the target is titanium oxide, zinc oxide, tin oxide, antimony oxide, niobium oxide, tungsten oxide or indium oxide, or the metal oxide doped by other metal or metal oxide. The metal and/or metal oxide corresponding to the metal of the resultant semiconductor layer of metal oxide can be generally employed.

The semiconductor electrode of organic dye-sensitized metal oxide formed by the vapor deposition process and having surface roughness Ra (centerline average height) of not less than 2 nm and void volume of not less than 25%, which is the preferred embodiment of the invention, can be advantageously obtained by a process of the steps comprising:

subjecting a transparent electrode of a substrate having the transparent electrode thereon to a sputtering process using a metal and/or metal oxide as a target under the conditions of electric power density of not less than 2.5 W/cm$^2$ and pressure of not less than 0.6 Pa to form a semiconductor layer of metal oxide, and adsorbing an organic dye on a surface of the semiconductor layer.

In the process, it is preferred that the electric power density is not less than 11 W/cm$^2$ and pressure is not less than 2.0 Pa. The sputtering is preferably carried out using metal titanium as a target with flowing oxygen. Otherwise, the sputtering is preferably carried out using electrically conductive titanium oxide as a target with flowing oxygen. The semiconductor layer of metal oxide preferably is titanium oxide, especially anatase-form titanium oxide. The thickness of the semiconductor layer of metal oxide preferably is not less than 10 nm. The sputtering preferably is the opposite target type diode sputtering process. Further reactive sputtering is also preferred.

The transparent electrode preferably comprises at least one selected from indium oxide, tin oxide, zinc oxide, tin-doped indium oxide (ITO), antimony-doped tin oxide (ATO), and aluminum-doped zinc oxide (ZAO).

Further, in the invention, the transparent preferably is the following electrode (1) or (2), or the combination of (1) and (2).

The transparent electrode (1) includes a metal layer having a number of holes. The metal layer preferably is in the form of net or lattice. The rate of hole area of the metal layer generally is not less than 50%, further not less than 70%, especially not less than 85%. The dimension of the hole is preferably not more than 2.00 mm, especially not more than 0.3 mm in terms of the maximum diameter or maximum diagonal, or preferably not more than 10 meshes, especially not more than 50 meshes. Especially preferred is in the range of 1 μm to 2.00 mm, further in the range of 10 μm to 0.3 mm. The thickness of the metal layer preferably is 5 nm to 10 μm.

The holes of the metal layer is preferably formed by etching. The metal layer having the holes is preferably formed by a vapor deposition process.

In case of forming the holes by etching, an adhesive layer is preferably provided between the substrate and the metal layer (which generally comprises metal foil).

The surface resistance of the transparent electrode generally is not more than 10 Ω/□, preferably not more than 3 Ω/□, especially not more than 2 Ω/□.

The metal layer preferably is a film of iron, copper, nickel, titanium, aluminum, stainless or brass.

The above-mentioned transparent electrode generally comprises the metal layer and a transparent conductive layer provided thereon, and the transparent conductive layer is formed by a vapor deposition process. The transparent conductive layer preferably comprises at least one selected from indium oxide, tin oxide, zinc oxide, tin-doped indium oxide (ITO), antimony-doped tin oxide (ATO), and aluminum-doped zinc oxide (ZAO). The vapor deposition process generally is a vacuum deposition process, a sputtering process, an ion plating process, a chemical vapor deposition (CVD) process or a plasma chemical vapor deposition (plasma CVD) process.

The transparent electrode (2) is a laminate formed by superposing a metal compound thin layer and a metal thin layer alternately. The metal compound layer is preferably formed by a vapor deposition process, especially a vacuum deposition process, a sputtering process, an ion plating process, a CVD process or a plasma CVD process. The metal compound layer generally comprises at least one compound selected from metal oxides, metal nitrides and metal carbides; for example, at least one dielectric metal oxide selected from beryllium oxide, magnesium oxide, aluminum oxide, silicon oxide, titanium oxide, chromium oxide, manganese oxide, iron oxide, cobalt oxide, nickel oxide, copper oxide, niobium oxide, molybdenum oxide, lead oxide and silver oxide; or at least one compound selected from indium oxide, tin oxide, zinc oxide, tin-doped indium oxide (ITO), antimony-doped tin oxide (ATO), and aluminum-doped zinc oxide (ZAO). The metal layer is preferably formed by a vapor deposition process, especially a vacuum deposition process, a sputtering process, an ion plating process, a CVD process or a plasma CVD process. The metal layer preferably is a layer comprising gold, silver, platinum or nickel, or a layer of silver/platinum alloy, a layer of gold/silver alloy, a laminate of silver layer/platinum layer or a laminate of gold layer/silver layer.

The alternate laminate of the metal compound layer and the metal layer preferably has (2n+1) layered structure formed by superposing (n+1) metal compound layers and n metal layers alternately, wherein n is an integer, preferably 2 to 12, especially 3 to 9. Further, the alternate laminate of the metal compound layer and the metal layer preferably has 2n layered structure formed by superposing n metal compound layers and n metal layers alternately, wherein n is an integer, preferably 2 to 12, especially 3 to 9. The transparent electrode preferably has transmission of 60 to 80% in wavelength of 400 to 700 nm.

In the semiconductor electrode having the above transparent electrodes (1) and (2), the semiconductor layer of metal oxide may be not only the electrode formed by the vapor deposition process but also one formed by the "sol-gel" method.

In the present invention, an antireflection layer is preferably formed on a surface having no transparent electrode of the transparent substrate. The antireflection layer preferably is an alternative laminate of a high refractive index-thin layer and a low refractive index-thin layer. Especially, the antireflection layer is the alternative laminate in which a layer at the furthest from the substrate is a low refractive index-thin layer. Further the antireflection layer preferably is formed by superposing alternatively a high refractive index-thin layer and a low refractive index-thin layer in this order one by one. The total of the thin layers is preferably in the range of 3 to 5 layers. In the antireflection layer of the invention, the high refractive index-thin layer has relatively high refractive index and a low refractive index-thin layer has relatively low refractive index.

The above low refractive index-thin layer preferably has refractive index of 1.55 or less, and is a film including silicon oxide, fluorine compound or aluminum compound, for example $SiO_2$, $MgF_2$ or $Al_2O_3$. Further, the low refractive index-thin layer preferably is also a film including organic polymer or inorganic polymer. When the thin film is a cured film of ultraviolet-curable resin, it can be particularly easily formed. The low refractive index-thin film can be also formed by a vapor deposition process.

The above high refractive index-thin film preferably have refractive index of more than 1.55 and is a film comprising metal oxide, for example, tin-doped indium oxide (ITO), ZnO, Aluminum-doped zinc oxide (ZAO), $TiO_2$, $SnO_2$, and ZrO. Further, the high refractive index-thin film preferably is also a film including organic polymer or inorganic polymer. When the thin layer is a cured film of ultraviolet-curable resin, it can be particularly easily formed. The high refractive index-thin film can be also formed by a vapor deposition process In the semiconductor electrode having the above antireflection layer, the semiconductor layer of metal oxide may be not only the electrode formed by the vapor deposition process but also one formed by the "sol-gel" method.

DETAILED DESCRIPTION OF THE INVENTION

Embodiments of the semiconductor electrode of organic dye-sensitized metal oxide and solar cell according to the invention are explained in detail by referring to drawings.

Figure 1:
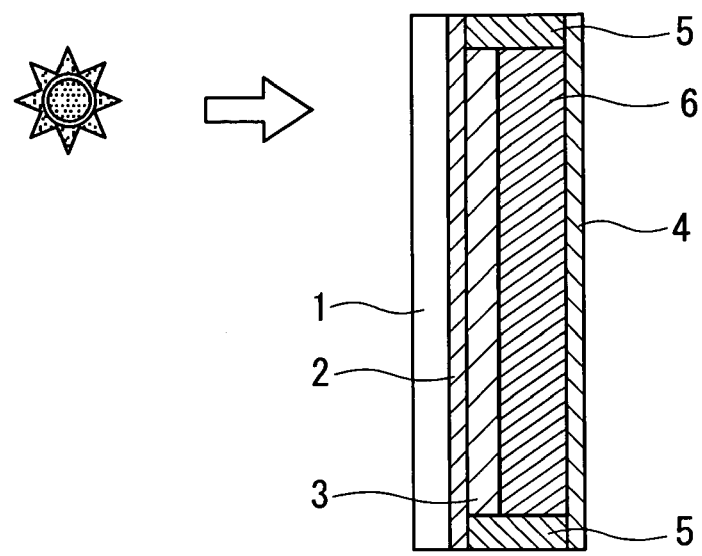
FIG. 1 is a section view showing an example of an embodiment of a solar cell according to the present invention.

FIG. 1 is a section view showing an example of an embodiment of an organic dye-sensitized solar cell according to the invention. In FIG. 1, a transparent electrode 2 is provided on a substrate 1, a semiconductor layer 3 of metal oxide on which a spectral sensitizing dye is adsorbed is formed on the transparent electrode 2, and an electrode couple 4 is provided above the semiconductor layer 3 of metal oxide so as to face a transparent electrode 2, and thus a laminate is obtained. Further, the outer edge of the laminate is sealed by a sealing agent 5, and redox electrolyte (dye solution) 6 is injected between the semiconductor layer 3 of metal oxide and the electrode couple 4. The semiconductor electrode of organic dye-sensitized metal oxide of the invention is basically composed of the substrate 1, the transparent electrode 2 and the semiconductor layer 3 of metal oxide.

The semiconductor electrode of metal oxide and the organic dye-sensitized solar cell according to the invention has the semiconductor layer of metal oxide 3 which is formed on the transparent electrode at low temperature by a vapor deposition process (i.e., vapor thin-film deposition process). It is not therefore required to use material having excellent heat resistance as the transparent electrode. Further, though glass is generally used as material of the substrate, materials (e.g., plastics) other than glass not having excellent heat resistance can be used as the substrate. Furthermore, the semiconductor layer of metal oxide 3 of the invention formed by the vapor deposition process has fine crystal structure, and hence is improved in dye-adsorbing property, whereby the solar cell having the semiconductor layer having high efficiency, excellent stability and long usable life can be obtained.

The substrate 1 is generally a transparent substrate, generally glass plate, usually silicate glass plate. As long as the transparency of visible rays is ensured, any materials such as various plastics are usable. The thickness of the substrate generally is 0.1 to 100 mm, preferably 0.3 to 5 mm. The glass plate is preferably reinforced in chemical or thermal resistance. When the formation of elements such as the transparent electrode is not formed at high temperature, the plastic plate can be used. Preferred examples of the plastic plate include a polyester (e.g., PET) plate or film.

As the transparent electrode 2, a thin film of electrically conductive metal oxide such as $In_2O_3$ or $SnO_2$ and a plate of electrically conductive material such as metal can be generally used. Preferred examples of the conductive metal oxide include $In_2O_3$:Sn (ITO), $SnO_2$:Sb, $SnO_2$:F, ZnO:Al, ZnO:F and Cd $SnO_4$.

The semiconductor layer 3 of metal oxide on which a spectral sensitizing dye is adsorbed (i.e., a semiconductor electrode for photoelectric conversion material) is formed on the transparent electrode 2. Examples of materials of the semiconductor layer of metal oxide generally include known semiconductor materials such as titanium oxide, zinc oxide, tungsten oxide, tin oxide, antimony oxide, niobium oxide, indium oxide, barium titanate, strontium titanate, cadmium sulfide. The materials can be employed singly or in combination of two kinds or more. Particularly titanium oxide is preferred in terms of stability and safety. Examples of titanium oxide include various titanium oxides such as anatase-form titanium oxide, rutile-form titanium oxide, amorphous titanium oxide, metatitanic acid and orthotitanic acid, and further titanium hydroxide and hydrated titanium oxide. In the invention, preferred is anatase-form titanium oxide. Further the semiconductor layer of metal oxide preferably has fine crystal structure. Furthermore the semiconductor layer of metal oxide preferably is a porous film. The thickness of the semiconductor layer of metal oxide is generally not less than 10 nm, preferably in the range of 100 to 1,000 nm.

In the invention, the semiconductor layer of metal oxide is formed by a vapor deposition process (vapor thin-film deposition process), for example, a physical deposition process, a vacuum deposition process, a sputtering process, an ion plating process, a CVD process or a plasma CVD process, or a dipolar sputtering process, a high frequency sputtering process. Especially, preferred are a sputtering process, an electron beam-heating type vacuum deposition process and an electron beam-heating type ion plating process. The sputtering process is particularly preferred. In more detail, in order to form a film having excellent crystallinity at low temperature, it is preferred to use the sputtering process, especially the following opposed target system sputtering process which is under plasma-free condition in the formation of film. Though, in the vapor deposition process, metal or metal oxide is used as a target, use of highpurity metal oxide is preferred.

In the invention, the semiconductor layer 3 of metal oxide is preferably formed by a opposed target type diode sputtering process. The semiconductor layer of metal oxide can be formed at reduced temperature and high rate by the opposed bipolar target system-sputtering process, and the resultant semiconductor layer is a porous film having fine crystal structure. The resultant semiconductor layer is therefore improved in dye adsorbing property and hence a solar cell having the semiconductor layer shows high conversion efficiency of light energy.

Figure 2:
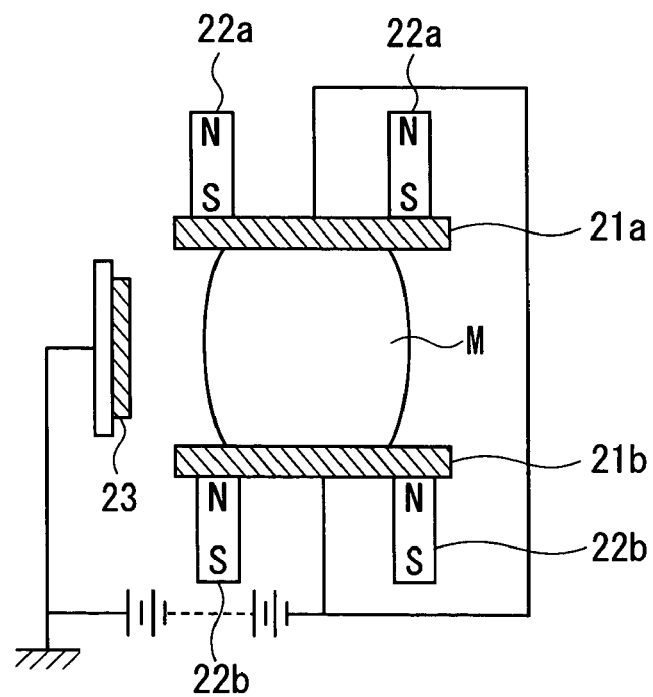
FIG. 2 is a section view showing an example of the device used in a process for forming a semiconductor layer of metal oxide by an opposite target type diode sputtering process according to the invention.

A process for forming the semiconductor layer of metal oxide using the opposed target type diode sputtering process is explained referring to FIG. 2. Target electrodes 21a, 21b (having target thereon) are oppositely disposed and magnets 22a, 22b are each disposed behind the electrodes, the magnet field M being formed perpendicularly to the faces of the target electrodes. When voltage is applied to the electrodes, plasma is formed in front of the magnet field. Particles sputtered are deposited on a substrate disposed outside the formed plasma to form a semiconductor layer. Because the substrate is disposed outside the plasma, particles having high energy from the target do not strike out a surface of a growing layer which will become a semiconductor layer. Thus the semiconductor layer in the form of porousness is formed without the strike of particles having high energy. Hence, the resultant semiconductor layer of metal oxide is improved in dye adsorbing property and hence a solar cell having the semiconductor layer shows high conversion efficiency of light energy.

In the opposed target type diode sputtering process of the invention, a reactive sputtering process, that is a sputtering process carried out by sputtering metal or metal oxide with introducing oxygen gas, is preferably utilized. Particularly, it is preferred to carry out a sputtering by using metal titanium or titanium oxide as a target with flowing oxygen gas.

In the invention, the semiconductor layer 3 of metal oxide is preferably formed by a dual cathode type magnetron sputtering process. The semiconductor layer of metal oxide can be formed at reduced temperature and high rate by the dual cathode type magnetron sputtering process, and the resultant semiconductor layer is a porous film having fine crystal structure. The resultant semiconductor layer is therefore improved in dye adsorbing property and hence a solar cell having the semiconductor layer shows high conversion efficiency of light energy.

The dual cathode type magnetron sputtering process is especially useful in a reactive sputtering process in which a semiconductor layer of metal oxide is formed using oxygen gas or the like. In more detail, by the combination of the dual cathode type magnetron sputtering process and the reactive sputtering process, the reactive sputtering process can be carried out at high speed and the formation of an insulating layer of oxide or the like is prevented on the edge of the target during sputtering to bring about stable discharge, whereby abnormal discharge such as arc discharge doing damage to the substrate or target scarcely occurs. Hence, the resultant semiconductor layer of metal oxide is improved in quality; for example semiconductor layer having uniform composition can be easily obtained.

As the dual cathode type magnetron sputtering process, there have been known a bipolar type dual magnetron sputtering process and a unipolar type dual magnetron sputtering process. Processes for forming the semiconductor layer of metal oxide by these processes are explained referring to FIGS. 3 and 4.

Figure 3:
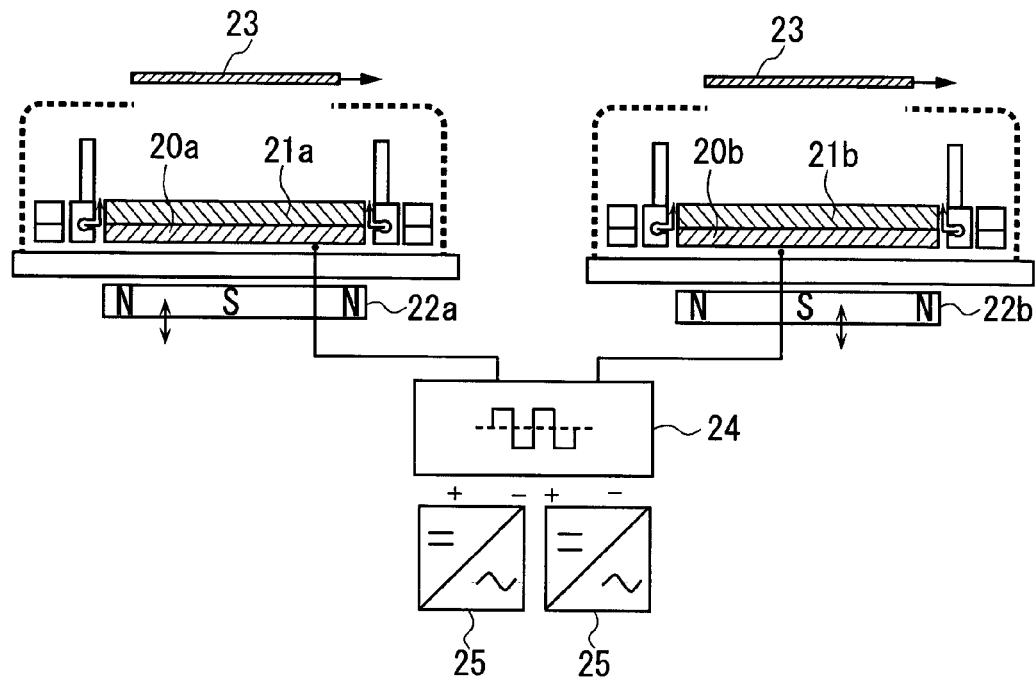
FIG. 3 is a section view showing an example of the device used in a process for forming a semiconductor layer of metal oxide by a bipolar type dual magnetron sputtering process according to the invention.
Figure 5:
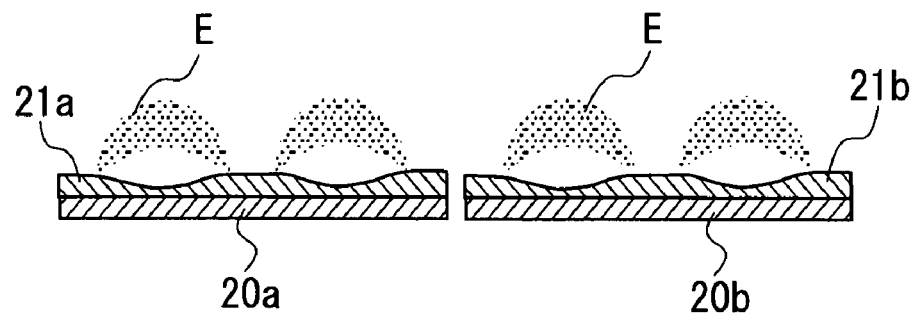
FIG. 5 is a schematic view showing an example of the condition of glow discharge on a target in the dual magnetron sputtering process of FIG. 3 or 4.

An example of schematic view for explaining the bipolar type dual magnetron sputtering process is shown in FIG. 3. A sputtering section has a target electrode comprising a support 20a and a target 21a provided thereon, and a magnet 22a provided behind the target electrode. Another sputtering section has a target electrode comprising a support 20b and a target 21b provided thereon, and a magnet 22b provided behind the target electrode. The former sputtering section is disposed adjacently to the latter sputtering section, and an AC power source 25 is connected to these sections through a switching unit 24. A magnetic field is formed between the adjacent magnets (between N and S), and the application of voltage brings about the formation of glow discharge E in the magnetic field (referring to FIG. 5). Thus, sputtered particles are deposited on a substrate 23 which is moving in the right direction above the sections whereby a semiconductor layer of metal oxide is formed on the substrate. In the process, the targets 21a, 21b are sputtered alternately using the switching unit 24 due to the discharge by AC, and hence the semiconductor layer can be formed stably and at high rate. Further, electric charge accumulated on the edge of the target is canceled by opposite electric charge owing to the switching operation, and hence it is possible to form a sputtered layer of a stable composition without doing damage to the substrate or target, whereby a uniform semiconductor layer of metal oxide can be obtained.

Figure 4:
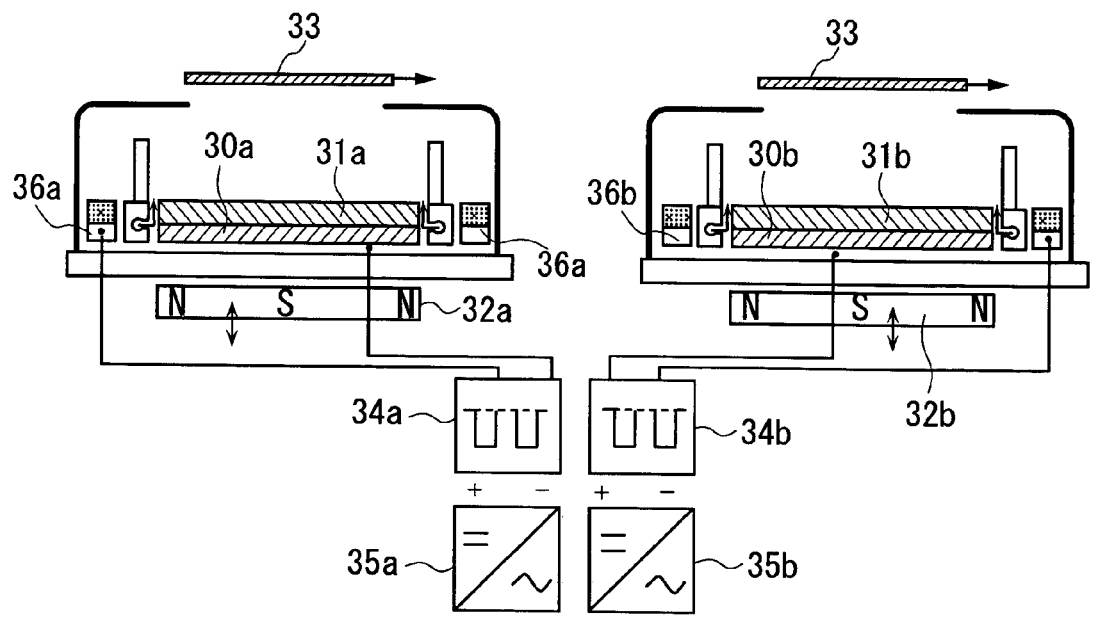
FIG. 4 is a section view showing an example of the device used in a process for forming a semiconductor layer of metal oxide by a unipolar type dual magnetron sputtering process according to the invention.

An example of schematic view for explaining the unipolar type dual magnetron sputtering process is shown in FIG. 4. A sputtering device has a target electrode comprising a support 30a and a target 31a provided thereon, and a magnet 32a provided behind the target electrode. Another sputtering device has a target electrode comprising a support 30b and a target 31b provided thereon, and a magnet 32b provided behind the target electrode. The former sputtering device is disposed adjacently to the latter sputtering device, and AC power sources 35a, 35b are connected to these sections through switching units 34a, 34b, respectively, and further returned to edge terminals 36a, 36b. A magnetic field is formed between the adjacent magnets (between N and S), and the application of voltage brings about the formation of glow discharge E in the magnetic field (referring to FIG. 5). Thus, sputtered particles are deposited on a substrate 33 which is moving in the right direction above the devices whereby a semiconductor layer of metal oxide is formed on the substrate. In the process, the discharge by AC is formed alternately on the targets 31a, 31b by using the switching units 34a, 34b, and hence the sputtering is carried out alternately, which result in that the semiconductor layer can be formed stably and at high rate. Similarly as above, the resultant semiconductor layer of metal oxide comes to a porous layer and hence a solar cell having the semiconductor layer shows high conversion efficiency of light energy.

In the dual cathode type magnetron sputtering process of the invention, a reactive sputtering process, that is a sputtering process carried out by sputtering metal or metal oxide with introducing oxygen gas or the like, is preferably utilized. Particularly, it is preferred to carry out a sputtering by using metal titanium or titanium oxide as a target with flowing oxygen gas.

Figure 6:
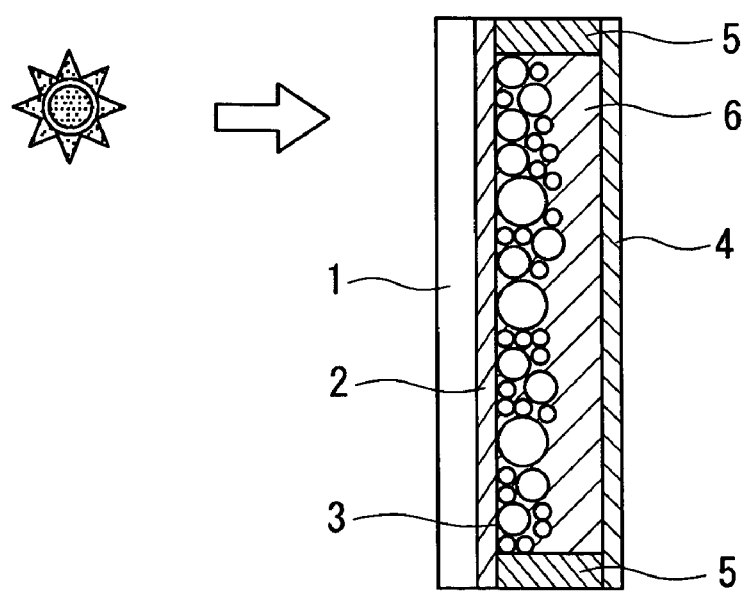
FIG. 6 is a section view showing another example of an embodiment of the solar cell according to the invention.

The semiconductor layer of metal oxide of the invention, which is formed by the vapor deposition process, preferably has the surface roughness Ra (arithmetical mean of Ra) of not less than 2 nm, the Ra being an arithmetic mean value defined as centerline average height, and the void volume of not less than 25%. A section view of an example of an embodiment of dye-sensitized solar cell having the above semiconductor layer of metal oxide is shown in FIG. 6. In FIG. 6, a transparent electrode 2 is provided on a substrate 1, a semiconductor layer 3 of metal oxide on which a spectral sensitizing dye is adsorbed is formed on the transparent electrode 2, and an electrode couple 4 is provided above the semiconductor layer 3 of metal oxide so as to face a transparent electrode 2, and thus a laminate is obtained. Further, the outer edge of the laminate is sealed by a sealing agent 5, and redox electrolyte (dye solution) 6 is injected between the semiconductor layer 3 of metal oxide and the electrode couple 4. The semiconductor electrode of organic dye-sensitized metal oxide of the invention is basically composed of the substrate 1, the transparent electrode 2 and the semiconductor layer 3 of metal oxide. As is apparent from FIG. 6, the semiconductor layer 3 of metal oxide provided on the transparent electrode of the substrate has a shape formed by connecting a number of sphere-shaped particles having various dimensions to one another. The shape has an extremely uneven surface and a number of pores in its inner. Thus the layer has the specified surface roughness Ra and the specified void volume. The surface roughness Ra preferably is not less than 5 nm, especially not less than 10 nm, and the void volume preferably is not less than 30%, especially not less than 35%. Thereby the amount of adsorption of the organic dye is further increased to enhance the conversion efficiency of light energy. The upper limit of the surface roughness Ra is not specified. In more detail, if the increase of the amount of adsorption of organic dye is ensured, Ra may be 10 mm or more. However, the upper limit generally is approx. 1 mm. The upper limit of the void volume is near to 100%, if the amount of adsorption of organic dye is increased. However the upper limit of the void volume preferably is approx. 95% so as to maintain the shape of the layer.

As mentioned above, the semiconductor layer 3 of metal oxide has a large surface area in its surface and also a large surface area in its void. Therefore the semiconductor layer has a large surface area for adsorbing the organic dye. Further the semiconductor layer has the above shape (structure) and hence the organic dye can easily permeate the surface and inner of the semiconductor layer to enable adsorption of organic dye in short time period. Moreover, since the semiconductor layer has a large surface area in its surface and in its inner to increase the adsorbed amount of organic dye of the layer, the layer comes to have enhanced conversion efficiency of light energy.

The semiconductor layer having the above-mentioned structure can be obtained under the various conditions by a vapor deposition process. However, it is basically preferred that the vapor deposition process is carried out under the conditions of high electric power, high gas pressure and short time period. Further it is also preferred to adopt utilization of variation of the ratio of flowing amounts of mixed gases or use of arc ion sputtering, or the combination thereof.

The semiconductor layer of metal oxide having the specific surface roughness can be formed using as a target metal and/or metal oxide corresponding to the desired metal oxide by a vapor deposition process (i.e., vapor thin film deposition process) such as a physical vapor deposition process, a vacuum deposition process, a sputtering process, an ion plating process, a chemical vapor deposition (CVD) process or a plasma CVD process. Preferred process for forming the semiconductor layer of metal oxide is the sputtering process which is carried out under the conditions that the electric power applied to the target is not less than 1.3 W/cm$^2$, preferably not less than 2.6 W/cm$^2$, especially not less than 11 W/cm$^2$, and the pressure is not less than 0.6 Pa, not less than 2.0 Pa, not less than 2.6 Pa. Further the sputtering process preferably is an opposite target type diode sputtering process, and also a reactive sputtering process. The above sputtering process is carried out under more drastic conditions than usual conditions, and therefore the semiconductor layer can be rapidly formed whereby the semiconductor layer having the specified shape or structure according to the invention can be obtained. The obtained semiconductor layer has increased adsorbed amount of organic dye and enhanced conversion efficiency of light energy, and hence the resultant solar cell having the semiconductor layer shows high efficiency.

The opposed target type diode sputtering process can be carried out in the same manner as in FIG. 2. Also in the opposed target type diode sputtering process, the sputtering process is preferably carried out under the conditions that the electric power applied to the target is not less than 1.3 W/cm$^2$, preferably not less than 2.6 W/cm$^2$, especially not less than 11 W/cm$^2$, and the pressure is not less than 0.6 Pa, not less than 2.0 Pa, not less than 2.6 Pa. In this sputtering process the semiconductor layer can be rapidly formed under the condition that particles having high energy from the target do not strike out a surface of a growing layer which will become the semiconductor layer, whereby it is considered that the semiconductor layer of the invention has a largely uneven surface and high pore volume.

The opposed target type diode sputtering process is preferably carried out according to a reactive sputtering process, in which sputtering is carried out using metal or metal oxide as a target with flowing a reactive gas such as oxygen. Especially, the sputtering is preferably carried out using metal titanium or metal oxide, particularly electrically conductive titanium oxide as a target with flowing oxygen gas.

On the surface of the semiconductor layer which is formed on the substrate as described above, an organic dye (spectral sensitizing dye) is adsorbed in the form of monomolecular film. The spectral sensitizing dye has absorption in the visible ray region and/or infrared region. In the invention, one kind or two or more kinds selected from various metal complexes and organic dyes can be used. The spectral sensitizing dye having a carboxyl group, a hydroxyalkyl group, a hydroxyl group, a sulfonic acid group, and/or a carboxyalkyl group in its molecule is preferred owing to its rapid adsorption to the semiconductor layer. The metal complexes are preferred due to its excellent spectral sensitization effect and durability. Examples of the metal complexes include metal phthalocyanine such as copper phthalocyanine and titanyl phthalocyanine, chlorophyll, hemin, complexes of ruthenium, osmium, iron and zinc described in JP-A-01-220380 and JP-A-05-504023. Examples of the organic dyes include metal-free phthalocyanine, cyanine dyes, merocyanine dyes, xanthene dyes and triphenylmethane dyes. Examples of trade names of cyanine dyes include NK1194 and NK3422 available from Japan Photosensitive Dye Laboratory Co., Ltd. Examples of trade names of merocyanine dyes include NK2426 and NK2501 available from Japan Photosensitive Dye Laboratory Co., Ltd. Examples of xanthene dyes include uranine, eosin, Rose Bengal, rhodamine B and dibromofluorescein. Examples of triphenylmethane dyes include malachite green and crystal violet.

In order to adsorb an organic dye (spectral sensitizing dye) on the semiconductor layer, the semiconductor layer having the substrate is dipped in an organic dye solution of the organic dye in an organic solvent at room temperature or under heating. Any solvent can be used so long as the organic dye is dissolved in the solvent. Examples of the solvent include water, alcohol, toluene and dimethylformamide.

Thus, the semiconductor electrode of organic-sensitized metal oxide (semiconductor for photoelectric conversion material) can be prepared.

As the transparent electrode, those described previously can be generally employed. However, the transparent electrode preferably includes a metal layer having a number of holes (generally perforated holes). The transparent electrode ((1) described previously) is generally composed of the metal layer and a transparent electrode layer (conventional material of transparent electrode). The metal layer preferably is a thin film having a number of holes and hence having net or lattice shape. Hence, the transparent electrode (1) having the metal layer maintains transparency and has extremely reduced resistance due to its metal material.

Figure 7:
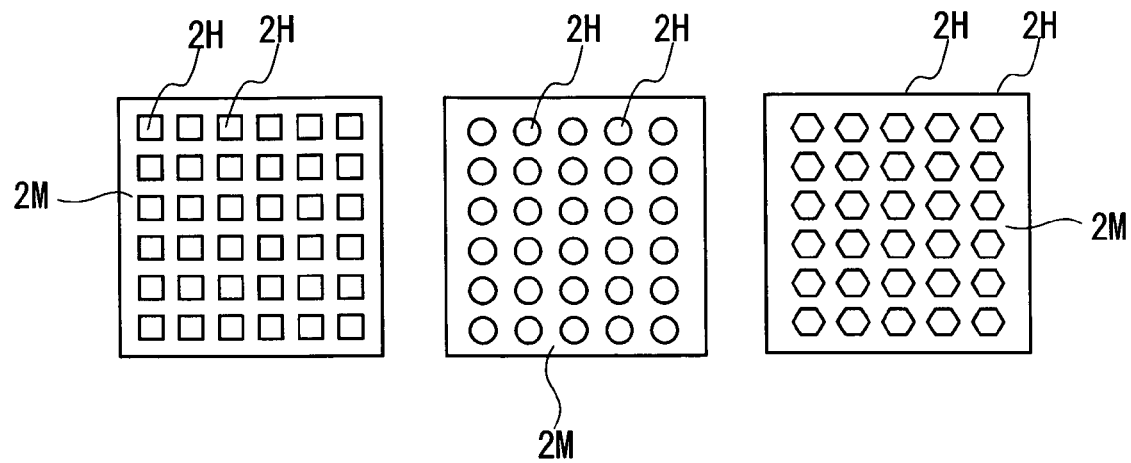
FIG. 7 is a section view showing an example of a metal layer having holes constituting the preferred transparent electrode according to the invention.

The metal layer having the holes has, for example the shapes illustrated in FIG. 7. FIG. 7 is a plan view when the metal layer is viewed from above. In FIG. 7, a large number of holes 2H are formed on a metal film 2M. Examples of the shapes of the holes include polygon (e.g., tetragon), circular form (e.g., circle, ellipse), rhomb, parallelogram, etc. The representative examples are shown in FIG. 7. All of the holes generally have the same shape as one another. However, the holes may have different shapes or areas from one another. Further the holes may be slits. Moreover, the outer edge of the metal layer may be continuous in the form of net shown in FIG. 7 or may be discontinuously.

The above-mentioned transparent electrode can be obtained, for example, by bonding a thin metal foil such as copper foil to the substrate by an adhesive, etching the metal foil to form holes whereby the metal layer is prepared, and subsequently forming a transparent conductive layer on the metal layer. The etching procedure is generally carried out by coating a photosensitive resist layer on the metal foil, exposing the resist layer to light in pattern of the holes, developing the exposed resist layer and etching the bared portions of the metal foil.

Figure 8:
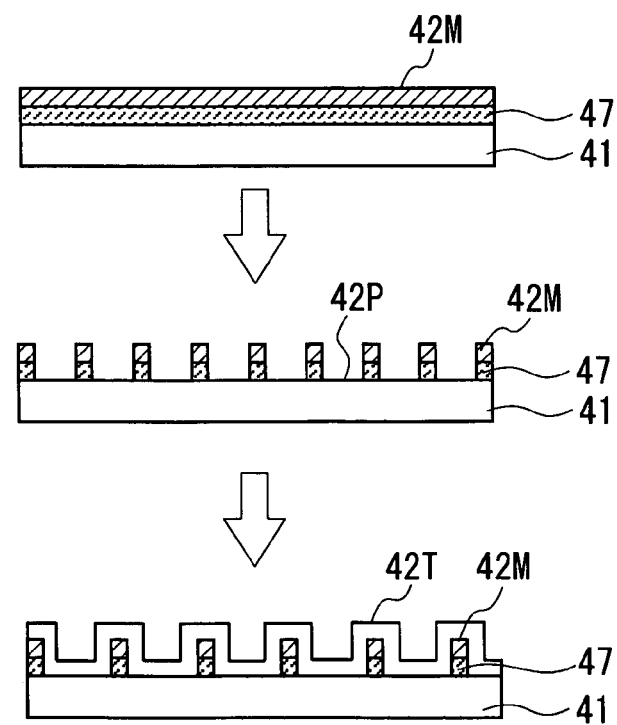
FIG. 8 is a section view showing an example of a process for the preparation of the preferred transparent electrode according to the invention.

FIG. 8 is a process chart for explaining an example of a process for the preparation of the above transparent electrode (1). In FIG. 8, a thin metal foil (film) 42M is formed on the substrate 41 through an adhesive layer 47, etching the metal foil in pattern of the holes using acid or alkali to form holes 42P on the metal foil, whereby the metal layer in the form of net or lattice provided with the adhesive layer 47 is prepared. Subsequently a transparent conductive layer 42T is formed on the metal layer by a sputtering process or the like to prepare the transparent electrode of the invention. The pattern used in the etching can be selected from the various shapes as described above. The transparent conductive layer 42T may be not provided but the provision is effective for reduction of resistance.

The metal layer in the form of the pattern can be also prepared by carrying out a vapor deposition process through a mask having net shape or the like arranged near to the substrate.

Though materials for forming the metal layer should be not particularly restricted, the metal layer is preferably formed from metal such as iron, copper, nickel, titanium or aluminum, or an alloy such as stainless or brass. As the metal layer before the formation of the holes, there can be used a foil, a resin film adhesively provided with a metal foil thereon or a resin film provided with a metal foil thereon by a vapor deposition process. Though the thickness of the metal layer is not particularly restricted, it preferably is in the range of 10 μm to 1 mm. In the resin film adhesively provided with a metal foil, the thickness of the metal foil preferably is in the range of 0.1 to 100 μm. In the resin film provided with a metal foil thereon by a vapor deposition process, the thickness of the metal foil preferably is in the range of 5 nm to 10 μm.

The rate of hole area of the metal layer generally is not less than 50%, further not less than 70%, especially not less than 85%. Though the increase of the rate of hole area is preferred due to efficient utilization of solar energy, the above range is appropriate in consideration of the reduction of resistance. In case the metal layer is thick, the rate of hole area is generally required to be increased.

As the dimension of the hole, the maximum diameter or maximum diagonal of the hole is preferably not more than 2.00 mm, especially not more than 0.3 mm, or preferably not more than 10 meshes, especially not more than 50 meshes. Especially preferred is in the range of 1 μm to 2.00 mm, further in the range of 1 μm to 0.3 mm. The thickness of the metal layer preferably is in the range of 5 nm to 10 μm.

The surface resistance of the transparent electrode generally is not more than 10 Ω/□, preferably not more than 3 Ω/□, especially not more than 2 Ω/□.

The above-mentioned transparent electrode (1) generally comprises the metal layer and a transparent conductive layer provided thereon, and the transparent conductive layer is formed by a vapor deposition process. The transparent conductive layer is preferably formed from at least one selected from indium oxide, tin oxide, zinc oxide, tin-doped indium oxide (ITO), antimony-doped tin oxide (ATO), and aluminum-doped zinc oxide (ZAO). The vapor deposition process generally is a vacuum deposition process, a sputtering process, an ion plating process, a CVD process or a plasma CVD process.

In case of requiring heating in the formation of the semiconductor layer of metal oxide, the above structure of the transparent electrode (1) may be unstable to heat. Hence, between the transparent conductive layer (metal compound layer) and the metal layer, a layer of metal compound or metal different from the former metal compound or metal is preferably provided. Examples of the layer include a silicon nitride layer, an aluminum nitride layer and a nickel-chromium layer. The layer is generally provided in one or two layer.

The transparent electrode of the invention preferably is a laminate (transparent electrode (2) described previously) formed by superposing a metal compound thin layer and a metal thin layer alternately. In more detail, the utilization of the difference of refractive indexes (if necessary attenuation coefficient) between the metal compound thin layer and the metal thin layer enables optically selective transmission or reflection of light having certain wavelength range. By setting the wavelength range to an appropriate range, a transparent electrode having reduced resistance can be prepared with maintaining transparent. Further, this transparent electrode can easily be prepared at low temperature, and therefore there is disadvantage of doing damage to a substrate having poor resistance to heat.

In the invention, the metal thin layer is reduced in the thickness to reduce the resistance, while the metal compound thin layer is provided on the metal thin layer to protect the metal thin layer from heat deterioration. Thus the transparent electrode acquires extremely reduced resistance with controlling opaque tendency brought about by the metal thin layer.

Figure 9:
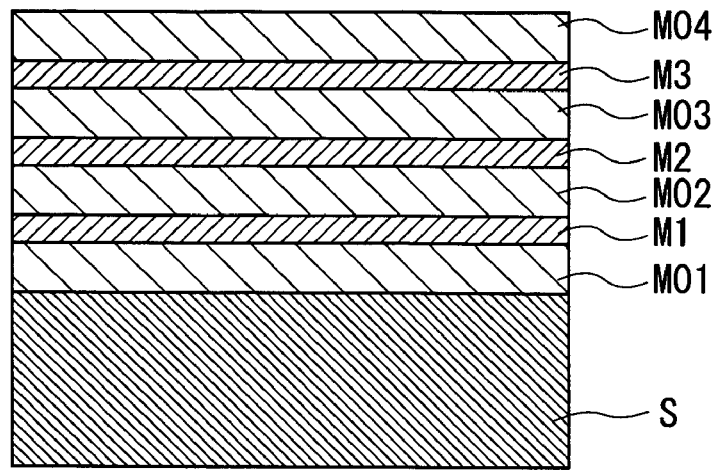
FIG. 9 is a section view showing an example of a structure of the preferred transparent electrode of the invention.

FIG. 9 shows a section view of an example of a structure of the above transparent electrode (2) of the invention. A metal compound thin layer MO1, a metal thin layer M1, a metal compound thin layer MO2, a metal thin layer M2, a metal compound thin layer MO3, a metal thin layer M3 and a metal compound thin layer MO4 are superposed on a substrate S in this order. In general, though the more the number of the thin layers, the lower the resistance is, the number of the layers is practically determined in view of transparence and economical efficiency.

The alternate laminate of the metal compound thin layer and the metal thin layer preferably has (2n+1) layered structure formed by superposing (n+1) metal compound layers and n metal layers alternately, wherein n is an integer, as shown in FIG. 9. n is generally 1, 2, or 3, or 4 or more. Further, n is preferably in the range of 2 to 12, especially 3 to 9.

Further, the alternate laminate of the metal compound layer and the metal layer preferably has 2n layered structure formed by superposing n metal compound layers and n metal layers alternately, wherein n is an integer. n is generally 1, 2, or 3, or 4 or more. Further, n is preferably in the range of 2 to 12, especially 3 to 9.

The thickness of the metal compound thin layer is preferably in the range of 5 to 500 nm, especially 10 to 200 nm. The thickness of the metal thin layer is preferably in the range of 0.1 to 100 nm, especially 1 to 50 nm. These thicknesses are generally depended on the number of layers superposed.

The transparent electrode preferably has transmission of 60 to 80% in wavelength of 400 to 700 nm. The surface resistance (surface resistivity) of the transparent electrode generally is not more than 10 $\Omega/\square$, preferably not more than 3 $\Omega/\square$.

Examples of materials of the metal compound layer include metal oxides such as silicon oxide, titanium oxide, indium oxide, tin oxide, zinc oxide, tin-doped indium oxide (ITO), antimony-doped tin oxide (ATO), and aluminum-doped zinc oxide (ZAO); metal nitrides such as titanium nitride and aluminum nitride; and metal carbides such as silicon carbide and titanium carbide. Preferred are indium oxide, tin oxide, zinc oxide, tin-doped indium oxide (ITO), antimony-doped tin oxide (ATO), and aluminum-doped zinc oxide (ZAO). Especially ITO is preferred.

Examples of materials of the metal layer preferably include noble metals such as gold, silver and platinum or nickel, general metals such as nickel, aluminum, iron and zinc, and further a layer of silver/platinum alloy, a layer of gold/silver alloy. Furthermore, there can be mentioned a laminate of silver layer/platinum layer or a laminate of gold layer/silver layer. Particularly preferred are gold, silver and platinum.

The metal compound and metal thin layers are preferably formed by a vapor deposition process, especially a vacuum deposition process, a sputtering process, an ion plating process, a CVD process or a plasma CVD process. Especially preferred are a sputtering process and an electron beam heating type-vacuum deposition process, particularly a sputtering process.

When heat is used in the formation of the semiconductor layer of metal oxide, the above structure of the transparent electrode (2) may become unstable to heat. Hence, between the metal compound layer and the metal layer, a layer of metal compound or metal different from the former metal compound or metal is preferably provided. Examples of the layer include a silicon nitride layer, an aluminum nitride layer and a nickel-chromium layer. The layer is generally provided in one or two layer.

In the semiconductor electrode of metal oxide of the invention, a antireflection layer is preferably formed on the incidence side of the sunlight of the transparent substrate. The sunlight incident is reflected by approx. 4% on the conventional glass plate used as the transparent substrate. In the preferred embodiment of the invention, the antireflection layer is provided in order to utilize effectively the lost light energy and prevent the transparent electrode from becoming opaque. In the solar cell, there has been no consideration with respect to the reverse side of the substrate so far.

Even a simple film comprising two layers or a film obtained by simple coating and curing without a vapor deposition process can be useful as the above antireflection layer. Further even if a structure comprising tree or more layers is adopted to enhance the antireflection effect, the film having the structure can be obtained by the simple coating and curing.

The antireflection layer includes laminates having the following structures (1) to (5):

(1) one transparent thin layer having lower refractive index than that of the substrate, the one transparent layer generally being the low refractive index-thin layer as mentioned below;

(2) a laminate of two layers in total composed of a high refractive index-thin layer (i.e., a thin layer having high refractive index) and a low refractive index-thin layer (i.e., a thin layer having low refractive index), which are superposed in this order;

(3) a laminate of four layers in total that a high refractive index-thin layer, a low refractive index-thin layer, a high refractive index-thin layer and a low refractive index-thin layer are superposed in this order;

(4) a laminate of three layers in total that a low refractive index-thin layer, a high refractive index-thin layer and a low refractive index-thin layer are superposed in this order, the first low refractive index-thin layer having an intermediate refractive index between the reflective indexes of the second high refractive index-thin layer and the third high refractive index-thin layer;

(5) a laminate of six layers in total that a high refractive index-thin layer, a low refractive index-thin layer, a high refractive index-thin layer, a low refractive index-thin layer, a high refractive index-thin layer and a low refractive index-thin layer are superposed in this order.

Figure 10:
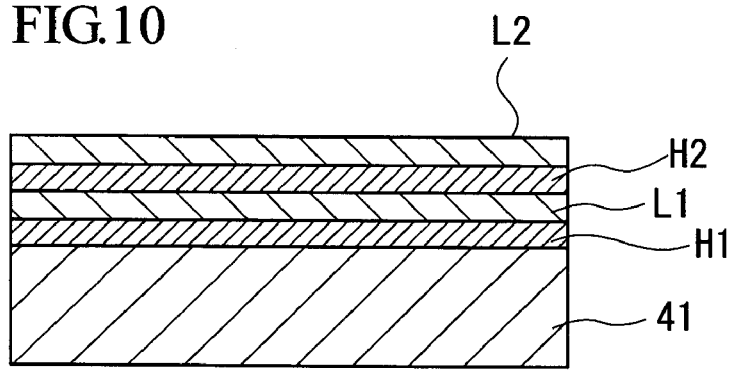
FIG. 10 is a section view showing an example of a structure of an antireflection layer which can be provided on a transparent substrate of the invention.
Figure 11:
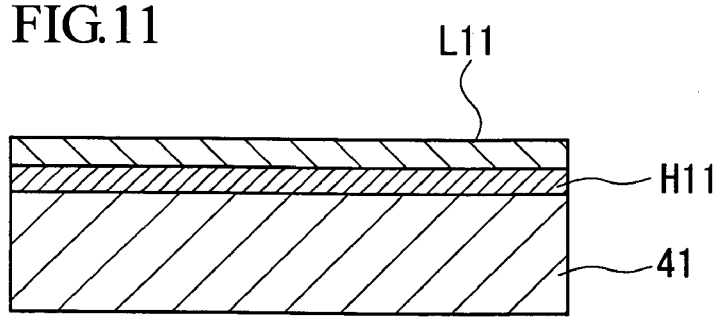
FIG. 11 is a section view showing another example of a structure of an antireflection layer which can be provided on a transparent substrate of the invention.

The section views of representative examples of the structures of the antireflection layers provided on the side having no transparent electrode of the substrate 1 (e.g., 1 in FIG. 1 or 6) are shown in FIGS. 10 and 11. These correspond to the above-mentioned antireflection layers (3) and (2).

In FIG. 10, a high refractive index-thin layer H1, a low refractive index-thin layer L1, a high refractive index-thin layer H2 and a low refractive index-thin layer L2 are superposed on a transparent substrate 41 in this order. The four thin layers constitute an antireflection layer. For example, $TiO_2$ as the high refractive index-thin layer and $SiO_2$ as the low refractive index-thin layer are generally used because they are easily obtainable.

In FIG. 11, a high refractive index-thin layer H11 and a low refractive index-thin layer L11 are superposed on a transparent substrate 41 in this order. The two thin layers constitute an antireflection layer. For example, $TiO_2$ as the high refractive index-thin layer and $SiO_2$ as the low refractive index-thin layer are generally used because they are easily obtainable.

The formation of the high and low refractive index-thin layers can be carried out using a vapor deposition process. However, the formation can be also done by coating process using a polymer binder, which is particularly advantageously in that an antireflection layer of two thin layers is easily formed.

The low refractive index-thin layer generally have refractive index of 1.55 or less, and preferably is a thin layer comprising a silicon oxide (e.g., $SiO_2$), a fluorine compound (e.g., $MgF_2$), or an aluminum compound (e.g., $Al_2O_3$). The low refractive index-thin layer can be formed by a vapor deposition process. Otherwise, the low refractive index-thin layer can be formed by preparing a coating liquid containing the powder of the material such as $SiO_2$ and an organic or inorganic polymer binder, applying the coating liquid onto the substrate and drying and if necessary curing. It is preferred to use ultraviolet curable resin as the binder and curing it due to the easy formation of the thin layer. For example, in case a $SiO_2$ thin layer is formed by coating, the resultant thin film generally has 30 to 50 weight % of $SiO_2$.

The high refractive index-thin layer generally have refractive index of more than 1.55, and preferably is a thin layer comprising metal oxide such as tin-doped indium oxide (ITO), ZnO, Al-doped zinc oxide (ZAO), $TiO_2$, $SnO_2$ or ZrO. The high refractive index-thin layer can be formed by a vapor deposition process. Otherwise, the high refractive index-thin layer can be formed by preparing a coating liquid containing the powder of the above material such as ITO and an organic or inorganic polymer binder, applying the coating liquid onto the substrate and drying and if necessary curing. It is preferred to use ultraviolet curable resin as the binder and curing it due to the easy formation of the thin layer. For example, in case a ITO thin layer is formed by coating, the resultant thin film generally has 80 to 89 weight % of ITO.

The thicknesses of the high and low refractive index-thin layers are appropriately set depending upon the number of layers superposed and materials used in the layers and the central wavelength so as to lower the reflectivity in a visible ray region by interference of light.

For example, in the case of the four-layered antireflection layer, it is preferred that a first high refractive index-thin layer provided on the transparent substrate side has thickness of 5 to 50 nm, a second low refractive index-thin layer has thickness of 5 to 50 nm, a third high refractive index-thin layer has thickness of 50 to 100 nm, and a forth low refractive index-thin layer has thickness of 50 to 150 nm. Further, in the case of the two-layered antireflection layer, it is preferred that a first high refractive index-thin layer provided on the transparent substrate side has thickness of 50 to 150 nm and a second low refractive index-thin layer has thickness of 50 to 150 nm.

Moreover, an anti-contamination layer may be formed on the antireflection layer to improve resistance to contamination. Examples of the anti-contamination layer include a fluoric resin thin layer and a silicone resin thin layer having the thickness of 1 to 1,000 nm.

The antireflection layer can be also used in the first and second invention. The materials of the spacers can use those described in the first invention. The transparent conductive film can be employed in the use of the first invention.

A solar cell of the invention is prepared by using the semiconductor electrode of organic dye-sensitized metal oxide obtained by forming the transparent electrode and the semiconductor layer of metal oxide where organic dye is adsorbed as described above. In more detail, the semiconductor layer for photoelectric conversion material is formed on the substrate (e.g., glass plate) coated with the transparent electrode (transparent conductive layer) to form the semiconductor electrode, and this electrode and another substrate (e.g., glass plate) coated with a transparent conductive layer as an electrode couple are bonded to each other using a sealing agent, and then an electrolyte is inserted between the electrode and the electrode couple whereby the solar cell can be obtained.

When a spectral sensitizing dye adsorbed on the semiconductor layer is exposed to light, the dye absorbs light in visible region to excite. Electrons generated by the excitation are moved to the semiconductor layer and the moved electrons reduce an oxidation-reduction system in the electrolyte. On the other hand, the spectral sensitizing dye from which the electrons are moved to the semiconductor layer becomes in the oxidized form. Thereafter the oxidized form is reduced by the oxidation-reduction system in the electrolyte, and thus returned to the original state. In this way, the electrons move in a stream, and the solar cell using the semiconductor electrode for photoelectric conversion material according to the invention fulfills its function.

Examples of the electrolyte (redox electrolyte) include a $I^-/I_3^-$ system, a $Br^-/Br_3^-$ system and a quinone/hydroquinone system. These redox electrolytes can be prepared by known methods. For examples, the $I^-/I_3^-$ system can be prepared by mixing ammonium salt of iodine with iodine. The electrolyte may be a liquid electrolyte or a solid electrolyte in which the liquid electrolyte is contained in a polymeric substance. The solvents of the liquid electrolyte generally are those inactive electrochemically, for example acetonitrile, propylene carbonate and ethylene carbonate. As long as the materials of the electrode couple has conductivity, there can be used any conductive material. Preferred are materials having catalytic action to make it possible to carry out a reduction reaction of oxidization type redox-ion (e.g., $I_3^-$ ion) at satisfactory rate. Examples of the materials having catalytic action include a platinum electrode, a conductive material having its surface metallized with platinum, a conductive material having its surface deposited with platinum, metal rhodium, metal ruthenium, ruthenium oxide and carbon.

The solar cell of the invention can be prepared by placing the above semiconductor electrode of metal oxide, electrolyte and electrode couple into a case and sealing them. However, the whole of the semiconductor electrode of metal oxide, electrolyte and electrode couple may be sealed using resin. In the cases, the structure of the solar cell is made up so that the semiconductor electrode receives light. In the cells having the structures, when the semiconductor electrode is exposed to the sunlight or a visible ray similar to the sunlight, potential reference is generated between the semiconductor electrode and the electrode couple whereby electric current is caused between the semiconductor electrode and the electrode couple.

EXAMPLE

The invention is illustrated in detail using the following Examples.

Example 1

(1) Preparation of Transparent Electrode

The transparent electrode was prepared using a sputtering device as follows:

Sputtering was carried out on a glass plate (thickness: 2 mm) of a size of 5×5 cm using a ceramic target of ITO (Indium-tin oxide) having 100 mm φ with flowing Ar gas of 10 cc/min. and oxygen gas of 1.5 cc/min. for five minutes under the conditions of pressure within the device of 5 mTorr and supply electric power of 500 W. Thus the ITO layer having the thickness of 3,000 Å was formed on the glass plate, which had surface resistivity of 10 Ω/□.

(2) Preparation of Semiconductor Layer of Metal Oxide

A titanium oxide thin layer was formed on the resultant glass plate provided with ITO transparent electrode using an electron beam heating type-vacuum deposition device as follows: A titanium oxide pellet having the purity of 99.99% was placed in a deposition source for an electron beam, and deposition was carried out under the condition of electric current of 250 mA to form a titanium oxide layer having the thickness of 3,000 Å.

(3) Adsorption of Spectral Sensitizing Dye

A spectral sensitizing dye represented by di(thiocyanato)-N-(2,2'-bipyridyl-4,4'-dicarboxylic acid)-N'-{2,2'-bipyridyl-4,4'-dicarboxylic acid-bis(tetrabutylammonium)}-ruthenium(II) was dissolved in ethanol to form a solution of the dye having concentration of $3 \times 10^{-4}$ mol/l. Subsequently, the above glass plate provided with titanium oxide layer was dipped in the dye ethanol solution and allowed to stand for 18 hours whereby a semiconductor electrode of metal oxide of the invention was obtained. The adsorption amount of the dye was 10 μg based on the surface area of titanium oxide layer of 1 cm$^2$.

(4) Preparation of Solar Cell

The resultant semiconductor electrode of metal oxide was used as one electrode of the solar cell, while a glass plate where fluorine-doped tin oxide was coated and further platinum was provided thereon was used as an electrode coupler. An electrolyte was injected between the electrode and the electrode coupler to form a laminate, and the side of the laminate was sealed by resin, and then lead wire was attached to it to form a solar cell of the invention. As the electrolyte, a 0.1 mol/l solution of lithium iodide in acetonitrile, a 0.3 mol/l solution of 1,2-dimethyl-3-propylimidazolium iodide in acetonitrile, a 0.05 mol/l solution of iodine in acetonitrile, and a 0.5 mol/l solution of t-butylpyridine in acetonitrile were used.

The solar cell was exposed to light having intensity of 100 W/cm$^2$ by a solar simulator. As a result, Voc (voltage in open-circuit) was 0.58V, Joc (electric current density caused in short of circuit) was 1.28 mA/cm$^2$, FF (curve factor) was 0.53, and ρ (conversion efficiency) was 3.96%. Hence, it was proved that the solar cell was useful.

Example 2

The procedure of Example 1 was repeated except for carrying out the preparation of semiconductor layer of metal oxide in the following manner to prepare a solar cell:

(2) Preparation of Semiconductor Layer of Metal Oxide

A titanium oxide thin layer was formed on the resultant glass plate provided with ITO transparent electrode using an electron beam heating type-vacuum deposition device as follows: A titanium oxide pellet having the purity of 99.99% was placed in a deposition source for an electron beam, and deposition was carried out under the condition of electric current of 250 mA to form a titanium oxide layer having the thickness of 3,000 Å. The glass plate having the titanium oxide layer was further subjected to heat treatment at 500° C. for 30 minutes.

The resultant solar cell was exposed to light having intensity of 100 W/cm$^2$ by a solar simulator. As a result, Voc (voltage in open-circuit) was 0.61V, Joc (electric current density caused in short of circuit) was 1.32 mA/cm$^2$, FF (curve factor) was 0.53, and ρ (conversion efficiency) was 4.26%. Hence, it was proved that the solar cell was useful.

Comparison Example 1

The procedure of Example 1 was repeated except for carrying out the preparation of semiconductor layer of metal oxide in the following manner to prepare a solar cell:

(2) Preparation of Semiconductor Layer of Metal Oxide

Titanium powder (P-25, available from Nippon Aerosil Co., Ltd) 6 g was homogeneously dispersed in a mixture of 8 ml of deionized water, 0.2 ml of acetylacetone and 0.2 ml of a surfactant. The resultant dispersed liquid was applied onto the ITO transparent electrode, sintered at 500° C. for one hour to prepare a semiconductor electrode having the thickness of 10 μm.

The adsorption amount of the dye of the semiconductor electrode was 10 μg based on the surface area of titanium oxide layer of 1 cm$^2$.

The resultant solar cell was exposed to light having intensity of 100 W/cm$^2$ by a solar simulator. As a result, Voc (voltage in open-circuit) was 0.62V, Joc (electric current density caused in short of circuit) was 1.00 mA/cm$^2$, FF (curve factor) was 0.56, and ρ (conversion efficiency) was 3.50%. Hence, it was not proved that the solar cell was useful compared with those of Examples.

Example 3

Opposed Target Type-Dipole Sputtering (1) Preparation of Transparent Electrode

The transparent electrode was prepared using a sputtering device as follows:

Sputtering was carried out on a glass plate (thickness: 2 mm) of a size of 5×5 cm using a ceramic target of ITO (Indium-tin oxide) having 100 mm φ with flowing Ar gas of 10 cc/min. and oxygen gas of 1.5 cc/min. for five minutes under the conditions of pressure within the device of 5 mTorr and electric power of 500 W. Thus the ITO layer having the thickness of 3,000 Å was formed on the glass plate, which had surface resistivity of 10 Ω/□.

(2) Preparation of Semiconductor Layer of Metal Oxide

A titanium oxide thin layer was formed on the resultant glass plate provided with ITO transparent electrode using an opposed target type diode sputtering device shown in FIG. 2 as follows: Two sheets of metal titanium targets having diameter of 100 mm were placed above the glass plate, oxygen gas of 5 cc/min. and Ar gas of 5 cc/min. were introduced into the device to adjust pressure within the device to 5 mTorr, and then the sputtering was carried out at supply electric power of 1.6 kW for 60 minutes to form a titanium oxide layer having the thickness of 3,000 Å.

(3) Adsorption of Spectral Sensitizing Dye

A spectral sensitizing dye represented by di(thiocyanato)-N-(2,2'-bipyridyl-4,4'-dicarboxylic acid)-N'-{2,2'-bipyridyl-4,4'-dicarboxylic acid-bis(tetrabutylammonium)}-ruthenium(II) was dissolved in ethanol to form a solution of the dye having concentration of $3 \times 10^{-4}$ mol/l. Subsequently, the above glass plate provided with titanium oxide layer was dipped in the dye ethanol solution and allowed to stand for 18 hours whereby a semiconductor electrode of metal oxide of the invention was obtained. The adsorption amount of the dye was 10 μg based on the surface area of titanium oxide layer of 1 cm$^2$.

(4) Preparation of Solar Cell

The resultant semiconductor electrode of metal oxide was used as one electrode of the solar cell, while a glass plate where fluorine-doped tin oxide was coated and further platinum was provided thereon was used as an electrode coupler. An electrolyte was injected between the electrode and the electrode coupler to form a laminate, and the side of the laminate was sealed by resin, and then lead wire was attached to it to form a solar cell of the invention. As the electrolyte, a 0.1 mol/l solution of lithium iodide in acetonitrile, a 0.3 mol/l solution of 1,2-dimethyl-3-propylimidazolium iodide in acetonitrile, a 0.05 mol/l solution of iodine in acetonitrile, and a 0.5 mol/l solution of t-butylpyridine in acetonitrile were used.

The solar cell was exposed to light having intensity of 100 W/cm² by a solar simulator. As a result, Voc (voltage in open-circuit) was 0.60V, Joc (electric current density caused in short of circuit) was 1.20 mA/cm², FF (curve factor) was 0.67, and ρ (conversion efficiency) was 4.8%. Hence, it was proved that the solar cell was useful.

Example 4

The procedure of Example 3 was repeated except for carrying out the preparation of semiconductor layer of metal oxide in the following manner to prepare a solar cell:

(2) Preparation of Semiconductor Layer of Metal Oxide

A titanium oxide thin layer was formed on the resultant glass plate provided with ITO transparent electrode using an opposed target type diode sputtering device shown in FIG. 2 as follows: Two sheets of conductive titanium targets having diameter of 100 mm were placed above the glass plate, Ar gas of 10 cc/min. were introduced into the device to adjust pressure within the device to 5 mTorr, and then the sputtering was carried out at supply electric power of 1.6 kW for 10 minutes to form a titanium oxide layer having the thickness of 3,000 Å.

The resultant solar cell was exposed to light having intensity of 100 W/cm² by a solar simulator. As a result, Voc (voltage in open-circuit) was 0.58V, Joc (electric current density caused in short of circuit) was 1.26 mA/cm², FF (Curve factor) was 0.68, and ρ (Conversion efficiency) was 4.96%. Hence, it was proved that the solar cell was useful.

Comparison Example 2

The procedure of Example 1 was repeated except for carrying out the preparation of semiconductor layer of metal oxide in the following manner to prepare a solar cell:

(2) Preparation of Semiconductor Layer of Metal Oxide

Titanium powder (P-25, available from Nippon Aerosil Co, Ltd) 6 g was homogeneously dispersed in a mixture of 8 ml of deionized water, 0.2 ml of acetylacetone and 0.2 ml of a surfactant. The resultant dispersed liquid was applied onto the ITO transparent electrode, sintered at 450° C. for 30 minutes to prepare a semiconductor electrode having the thickness of 10 μm.

The adsorption amount of the dye of the semiconductor electrode was 10 μg based on the surface area of titanium oxide layer of 1 cm².

The resultant solar cell was exposed to light having intensity of 100 W/cm² by a solar simulator. As a result, Voc (voltage in open-circuit) was 0.62V, Joc (electric current density caused in short of circuit) was 1.00 mA/cm², FF (Curve factor) was 0.56, and ρ (Conversion efficiency) was 3.50%. Hence, it was not proved that the solar cell was useful compared with those of Examples 3 and 4.

Example 5

Dual Magnetron Sputtering (1) Preparation of Transparent Electrode

The transparent electrode was prepared using a sputtering device as follows:

Sputtering was carried out on a glass plate (thickness: 2 mm) of a size of 5×5 cm using a ceramic target of ITO (Indium-tin oxide) having 100 mm φ with flowing Ar gas of 10 cc/min. and oxygen gas of 1.5 cc/min. for five minutes under the conditions of pressure within the device of 5 mTorr and supply electric power of 500 W. Thus the ITO layer having the thickness of 3,000 Å was formed on the glass plate, which had surface resistivity of 10 Ω/□.

(2) Preparation of Semiconductor Layer of Metal Oxide

A titanium oxide thin layer was formed on the resultant glass plate provided with ITO transparent electrode using a bipolar type dual magnetron sputtering device having the portion shown in FIG. 3 as follows: Two sheets of metal titanium targets having size of 125 mm×600 mm were placed in parallel with each other above the glass plate, oxygen gas of 50 cc/min. and Ar gas of 50 cc/min. were introduced into the device to adjust pressure within the device to 5 mTorr, and then the sputtering was carried out by applying triangular wave-AC electric field of 10 kHz at supply electric power of 10 kW for 20 minutes to form a titanium oxide layer having the thickness of 3,000 Å.

(3) Adsorption of Spectral Sensitizing Dye

A spectral sensitizing dye represented by di(thiocyanato)-N-(2,2'-bipyridyl-4,4'-dicarboxylic acid)-N'-{2,2'-bipyridyl-4,4'-dicarboxylic acid-bis(tetrabutylammonium)}-ruthenium(II) was dissolved in ethanol to form a solution of the dye having concentration of $3 \times 10^{-4}$ mol/l. Subsequently, the above glass plate provided with titanium oxide layer was dipped in the dye ethanol solution and allowed to stand for 18 hours whereby a semiconductor electrode of metal oxide of the invention was obtained. The adsorption amount of the dye was 10 μg based on the surface area of titanium oxide layer of 1 cm².

(4) Preparation of Solar Cell

The resultant semiconductor electrode of metal oxide was used as one electrode of the solar cell, while a glass plate where fluorine-doped tin oxide was coated and further platinum was provided thereon was used as an electrode coupler. An electrolyte was injected between the electrode and the electrode coupler to form a laminate, and the side of the laminate was sealed by resin, and then lead wire was attached to it to form a solar cell of the invention. As the electrolyte, a 0.1 mol/l solution of lithium iodide in acetonitrile, a 0.3 mol/l solution of 1,2-dimethyl-3-propylimidazolium iodide in acetonitrile, a 0.05 mol/l solution of iodine in acetonitrile, and a 0.5 mol/l solution of t-butylpyridine in acetonitrile were used.

The solar cell was exposed to light having intensity of 100 W/cm² by a solar simulator. As a result, Voc (voltage in open-circuit) was 0.59V, Joc (electric current density caused in short of circuit) was 1.23 mA/cm², FF (curve factor) was 0.65, and ρ (conversion efficiency) was 4.75%. Hence, it was proved that the solar cell was useful.

Example 6

The procedure of Example 5 was repeated except for carrying out the preparation of semiconductor layer of metal oxide in the following manner to prepare a solar cell:

(2) Preparation of Semiconductor Layer of Metal Oxide

The glass plate having the titanium oxide layer obtained in Example was placed in an electric furnace and further subjected to heat treatment at 500° C. for 30 minutes.

The resultant solar cell was exposed to light having intensity of 100 W/cm² by a solar simulator. As a result, Voc (voltage in open-circuit) was 0.57V, Joc (electric current density caused in short of circuit) was 1.27 mA/cm², FF (curve factor) was 0.68, and ρ (conversion efficiency) was 4.95%. Hence, it was proved that the solar cell was useful.

Example 7

The procedure of Example 5 was repeated except for carrying out the preparation of semiconductor layer of metal oxide in the following manner to prepare a solar cell:

(2) Preparation of Semiconductor Layer of Metal Oxide

A titanium oxide thin layer was formed on the resultant glass plate provided with ITO transparent electrode using a bipolar type dual magnetron sputtering device having the portion shown in FIG. 3 as follows: Two sheets of conductive titanium oxide having size of 125 mm×600 mm were placed in parallel with each other above the glass plate, and Ar gas of 50 cc/min. was introduced into the device to adjust pressure within the device to 5 mTorr, and then the sputtering was carried out by applying triangular wave-AC electric field of 10 kHz at supply electric power of 10 kW for 4 minutes to form a titanium oxide layer having the thickness of 3,000 Å.

The resultant solar cell was exposed to light having intensity of 100 W/cm$^2$ by a solar simulator. As a result, Voc (voltage in open-circuit) was 0.59V, Joc (electric current density caused in short of circuit) was 1.22 mA/cm$^2$, FF (curve factor) was 0.66, and ρ (conversion efficiency) was 4.77%. Hence, it was proved that the solar cell was useful.

Comparison Example 3

The procedure of Example 5 was repeated except for carrying out the preparation of semiconductor layer of metal oxide in the following manner to prepare a solar cell:

(2) Preparation of Semiconductor Layer of Metal Oxide

Titanium powder (P-25, available from Nippon Aerosil Co, Ltd) 6 g was homogeneously dispersed in a mixture of 8 ml of deionized water, 0.2 ml of acetylacetone and 0.2 ml of a surfactant. The resultant dispersed liquid was applied onto the ITO transparent electrode, sintered at 500° C. for one hour to prepare a semiconductor electrode having the thickness of 10 μm.

The adsorption amount of the dye of the semiconductor electrode was 10 μg based on the surface area of titanium oxide layer of 1 cm$^2$.

The resultant solar cell was exposed to light having intensity of 100 W/cm$^2$ by a solar simulator. As a result, Voc (voltage in open-circuit) was 0.62V, Joc (electric current density caused in short of circuit) was 1.00 mA/cm$^2$, FF (curve factor) was 0.56, and ρ (conversion efficiency) was 3.50%. Hence, it was not proved that the solar cell was useful compared with those of Examples 5 to 7.

Example 8

Specified Surface Roughness (1) Preparation of Transparent Electrode

The transparent electrode was prepared using a sputtering device as follows:

Sputtering was carried out on a glass plate (thickness: 2 mm) of a size of 5 cm×5 cm using a ceramic target of ITO (Indium-tin oxide) having 100 mm φ with flowing Ar gas of 10 cc/min. and oxygen gas of 1.5 cc/min. for five minutes under the conditions of pressure within the device of 5 mTorr and supply electric power of 500 W. Thus the ITO layer having the thickness of 3,000 Å was formed on the glass plate, which had surface resistivity of 10 Ω/□.

(2) Preparation of Semiconductor Layer of Metal Oxide

A titanium oxide thin layer was formed on the resultant glass plate provided with ITO transparent electrode using an opposed target type diode sputtering device shown in FIG. 2 as follows: Two sheets of metal titanium targets having diameter of 100 mm were placed above the glass plate, oxygen gas of 5 cc/min. and Ar gas of 5 cc/min. were introduced into the device to adjust pressure within the device to 5 mTorr (0.7 Pa), and then the sputtering was carried out at supply electric power of 3 kW (electric power density: 19 W/cm$^2$) for 32 minutes to form a titanium oxide layer having the thickness of 3,000 Å.

The surface roughness Ra (centerline average height) and the void volume of the resultant semiconductor layer (titanium oxide layer) were determined.

Measurement of the Surface Roughness:

The surface roughness Ra (centerline average height) of the resultant titanium oxide layer was determined using a contact surface roughness tester (Talystep, available from Taylor Hobson Co., Ltd).

Measurement of Void Volume:

The following weights were measured and the void volume was calculated by the following equation (the measurement was carried out according to JIS Z 8807):

Void volume=$(w1-w2)/w3 \times 100$ in which w1 is weight (g) of a sample sufficiently containing water, w2 is weight (g) of the sample completely dried, and w3 is buoyancy (g) of the sample.

As a result of the measurements, the surface roughness (arithmetical mean of Ra) was 5.2 nm and the void volume was 32%.

(3) Adsorption of Spectral Sensitizing Dye

A spectral sensitizing dye represented by di(thiocyanato)-N-(2,2'-bipyridyl-4,4'-dicarboxylic acid)-N'-{2,2'-bipyridyl-4,4'-dicarboxylic acid-bis(tetrabutylammonium)}-ruthenium(II) was dissolved in ethanol to form a solution of the dye having concentration of 3×10$^{-4}$ mol/l. Subsequently, the above glass plate provided with titanium oxide layer was dipped in the dye ethanol solution and allowed to stand for 18 hours whereby a semiconductor electrode of metal oxide of the invention was obtained. The adsorption amount of the dye was 10 μg based on the surface area of titanium oxide layer of 1 cm$^2$.

(4) Preparation of Solar Cell

The resultant semiconductor electrode of metal oxide was used as one electrode of the solar cell, while a glass plate where fluorine-doped tin oxide was coated and further platinum was provided thereon was used as an electrode coupler. An electrolyte was injected between the electrode and the electrode coupler to form a laminate, and the side of the laminate was sealed by resin and then lead wire was attached to it to form a solar cell of the invention. As the electrolyte, a 0.1 mol/l solution of lithium iodide in acetonitrile, a 0.3 mol/l solution of 1,2-dimethyl-3-propylimidazolium iodide in acetonitrile, a 0.05 mol/l solution of iodine in acetonitrile, and a 0.5 mol/l solution of t-butylpyridine in acetonitrile were used.

The solar cell was exposed to light having intensity of 100 W/cm$^2$ by a solar simulator. As a result, Voc (voltage in open-circuit) was 0.58V, Joc (electric current density caused in short of circuit) was 1.30 mA/cm$^2$, FF (curve factor) was 0.53, and ρ (conversion efficiency) was 4.01%. Hence, it was proved that the solar cell was useful.

Example 9

The procedure of Example 8 was repeated except for carrying out the preparation of semiconductor layer of metal oxide surface in the following manner to prepare a solar cell as follows:

(2) Preparation of Semiconductor Layer of Metal Oxide

The sputtering was carried out in the same manner as that of Example 8 except for changing the pressure within the device to 20 mTorr (2.8 Pa) and the sputtering time to 37 minutes to form a titanium oxide layer having the thickness of 3,000 Å.

As a result of the same measurements as Example 8, the surface roughness (arithmetical mean of Ra) was 10.3 nm and the void volume was 38%.

The resultant solar cell was exposed to light having intensity of 100 W/cm$^2$ by a solar simulator. As a result, Voc (voltage in open-circuit) was 0.59V, Joc (electric current density caused in short of circuit) was 1.31 mA/cm$^2$, FF (curve factor) was 0.53, and ρ (conversion efficiency) was 4.12%. Hence, it was proved that the solar cell was useful.

Comparison Example 4

The procedure of Example 8 was repeated except for carrying out the preparation of semiconductor layer of metal oxide in the following manner to prepare a solar cell:

(2) Preparation of Semiconductor Layer of Metal Oxide

Titanium powder (P-25, available from Nippon Aerosil Co, Ltd) 6 g was homogeneously dispersed in a mixture of 8 ml of deionized water, 0.2 ml of acetylacetone and 0.2 ml of a surfactant. The resultant dispersed liquid was applied onto the ITO transparent electrode, sintered at 500° C. for one hour to prepare a semiconductor electrode having the thickness of 10 μm.

The adsorption amount of the spectral sensitizing dye of the semiconductor electrode was 10 μg based on the surface area of titanium oxide layer of 1 cm$^2$.

As a result of the same measurements as Example 8, the surface roughness (arithmetical mean of Ra) was 10.5 nm and the void volume was 60%.

The resultant solar cell was exposed to light having intensity of 100 W/cm$^2$ by a solar simulator. As a result, Voc (voltage in open-circuit) was 0.62V, Joc (electric current density caused in short of circuit) was 1.00 mA/cm$^2$, FF (curve factor) was 0.56, and ρ (conversion efficiency) was 3.50%. Hence, it was not proved that the solar cell was useful compared with those of Examples 8 and 9. This is estimated to be because the sintering carried out at high temperature for a long-term period damaged the transparent electrode.

Comparison Example 5

The procedure of Example 8 was repeated except for carrying out the preparation of semiconductor layer of metal oxide in the following manner to prepare a solar cell:

(2) Preparation of Semiconductor Layer of Metal Oxide

The sputtering was carried out in the same manner as that of Example 8 except for changing the supply electric power (electric power density) to 0.4 kW (2.5 W/cm$^2$) and the sputtering time to 240 minutes to form a titanium oxide layer having the thickness of 3,000 Å.

As a result of the same measurements as Example 8, the surface roughness (arithmetical mean of Ra) was 1.8 nm and the void volume was 24%.

The resultant solar cell was exposed to light having intensity of 100 W/cm$^2$ by a solar simulator. As a result, Voc (voltage in open-circuit) was 0.58V, Joc (electric current density caused in short of circuit) was 0.30 mA/cm$^2$, FF (curve factor) was 0.60, and ρ (conversion efficiency) was 1.05%. Hence, it was proved that the solar cell was useful.

Comparison Example 5 used the same sputtering device as in Example 8 for forming the semiconductor layer, but the semiconductor layer of Comparison Example 5 had the reduced surface roughness and void volume not to exhibit sufficient properties for a solar cell.

Example 10

Transparent Electrode: Metal Layer having a Number of Holes (1) Preparation of Transparent Electrode The transparent electrode was prepared using a magnetron sputtering device as follows:

A copper foil (thickness: 13 μm) was bonded onto a PET film having thickness of 188 μm by urethane adhesive to prepare a laminate. The copper foil of the laminate was etched to form a copper foil (i.e., metal layer) in the form of lattice (line width: 10 μm, mesh number: 100/inch).

The metal layer formed on the PET film was placed in a magnetron sputtering device, Ar gas of 50 cc/min. and oxygen gas of 3 cc/min. were introduced into the device to adjust pressure within the device to 5 mTorr (0.7 Pa), and then the sputtering was carried out using a ceramic target of ITO (Indium-tin oxide) having a size of 100 mm×400 mm at supply electric power of 2,000 W for 5 minutes to form an ITO layer having the thickness of 3,000 Å, which had surface resistivity of 0.08 Ω/□.

Thus the resultant transparent electrode film having the metal layer in the form of lattice (referring to FIGS. 7 and 8) was obtained. The transparent electrode film was cut to sheets of size of 5 cm×5 cm.

(2) Preparation of Semiconductor Layer of Metal Oxide

A titanium oxide thin layer was formed on the transparent electrode film provided with the metal layer and ITO transparent electrode using an opposed target type diode sputtering device as follows: Two sheets of metal titanium targets having size of 100 mm×400 mm were placed above the transparent electrode film, and oxygen gas of 5 cc/min. and Ar gas of 5 cc/min. were introduced into the device to adjust pressure within the device to 5 mTorr (0.7 Pa), and then the sputtering was carried out at supply electric power of 10 kW for 60 minutes to form a titanium oxide layer having the thickness of 3,000 Å.

(3) Adsorption of Spectral Sensitizing Dye

A spectral sensitizing dye represented by di(thiocyanato)-N-(2,2'-bipyridyl-4,4'-dicarboxylic acid)-N'-{2,2'-bipyridyl-4,4'-dicarboxylic acid-bis(tetrabutylammonium)}-ruthenium(II) was dissolved in ethanol to form a solution of the dye having concentration of 3×10$^{-4}$ mol/l. Subsequently, the above film provided with titanium oxide layer was dipped in the dye ethanol solution and allowed to stand for 18 hours whereby a semiconductor electrode of metal oxide of the invention was obtained. The adsorption amount of the dye was 10 μg based on the surface area of titanium oxide layer of 1 cm$^2$.

(4) Preparation of Solar Cell

The resultant semiconductor electrode of metal oxide was used as one electrode of the solar cell, while a glass plate where fluorine-doped tin oxide was coated and further platinum was provided thereon was used as an electrode coupler. An electrolyte was injected between the electrode and the electrode coupler to form a laminate, and the side of the laminate was sealed by resin and then lead wire was attached to it to form a solar cell of the invention. As the electrolyte, a 0.1 mol/l solution of lithium iodide in acetonitrile, a 0.3 mol/l solution of 1,2-dimethyl-3-propylimidazolium iodide in acetonitrile, a 0.05 mol/l solution of iodine in acetonitrile, and a 0.5 mol/l solution of t-butylpyridine in acetonitrile were used.

The solar cell was exposed to light having intensity of 100 W/cm$^2$ by a solar simulator. As a result, Voc (voltage in open-circuit) was 0.58V, Joc (electric current density caused in short of circuit) was 1.46 mA/cm$^2$, FF (curve factor) was 0.61, and ρ (conversion efficiency) was 5.20%. Hence, it was proved that the solar cell was useful.

Example 11

The procedure of Example 10 was repeated except for carrying out cutting the transparent electrode film to a size of 30 cm×30 cm to prepare a solar cell.

The resultant solar cell was exposed to light having intensity of 100 W/cm$^2$ by a solar simulator. As a result, Voc (voltage in open-circuit) was 0.59V, Joc (electric current density caused in short of circuit) was 1.51 mA/cm$^2$, FF (curve factor) was 0.59, and ρ (conversion efficiency) was 5.24%. Hence, it was proved that the solar cell was useful.

Comparison Example 6

The procedure of Example 10 was repeated except for carrying out the preparation of transparent electrode (i.e., transparent electrode having no metal layer) as described below to prepare a solar cell:

(1) Preparation of Transparent Electrode

The transparent electrode was prepared using a magnetron sputtering device as follows:

A PET film (thickness: 188 μm) was placed in a magnetron sputtering device, Ar gas of 50 cc/min. and oxygen gas of 3 cc/min. were introduced into the device to adjust pressure within the device to 5 mTorr (0.7 Pa), and then the sputtering was carried out using a ceramic target of ITO (Indium-tin oxide) having a size of 100 mm×400 mm at supply electric power of 2,000 W for 5 minutes to form an ITO layer having the thickness of 3,000 Å, which had surface resistivity of 10 Ω/□. The transparent electrode film was cut to sheets of size of 5 cm×5 cm.

The resultant solar cell was exposed to light having intensity of 100 W/cm$^2$ by a solar simulator. As a result, Voc (voltage in open-circuit) was 0.60V, Joc (electric current density caused in short of circuit) was 1.20 mA/cm$^2$, FF (curve factor) was 0.67, and ρ (conversion efficiency) was 4.80%. Hence, it was not proved that the solar cell was useful compared with those of Examples 10 and 11.

Comparison Example 7

The procedure of Comparison Example 6 was repeated except for carrying out cutting the transparent electrode film to a size of 30 cm×30 cm to prepare a solar cell.

The resultant solar cell was exposed to light having intensity of 100 W/cm$^2$ by a solar simulator. As a result, Voc (voltage in open-circuit) was 0.76V, Joc (electric current density caused in short of circuit) was 0.95 mA/cm$^2$, FF (curve factor) was 0.60, and ρ (conversion efficiency) was 4.30%. Hence, it was not proved that the solar cell was useful compared with those of Examples.

As apparent from Examples 10 and 11 and Comparison Examples 6 and 7, the solar cell of Example 10 has reduced resistivity because the transparent electrode comprises the metal layer of the invention and dielectric substance, and further even the solar cell of Example 11 having increased area scarcely reduced photoelectric conversion. In contrast, the solar cell of Comparison Example 7 having the ITO film as the transparent electrode greatly reduced photoelectric conversion because of increased area.

Example 12

Transparent Electrode: Laminated Layer (1) Preparation of Transparent Electrode

The transparent electrode was prepared using a magnetron sputtering device as follows:

Sputtering was carried out on a glass plate (thickness: 2 mm) of a size of 5×5 cm using a ceramic target of ITO (Indium-tin oxide) having 100 mm×400 mm for the time period set forth in Table 1 under the conditions of pressure within the device of 5 mTorr set by flowing Ar gas of 50 cc/min. and oxygen gas of 3 cc/min. and supply electric power of 2,000 W. Thus the ITO layer having the thickness set forth in Table 1 was formed on the glass plate.

In order to form an Ag layer between two ITO layers, sputtering was carried out on the ITO layer using a silver target for the time period set forth in Table 1 under the conditions of pressure within the device of 5 mTorr set by flowing Ar gas of 50 cc/min. and supply electric power of 500 W. Thus the Ag layer having the thickness set forth in Table 1 was formed on the ITO layer.

Under the above conditions, the ITO layer and the Ag layer were alternately formed.

TABLE 1

| Layer | Kind of Material | Time for Forming Film (sec.) | Thickness (nm) |
| --- | --- | --- | --- |
| First Layer | ITO | 40 | 40 |
| Second Layer | Ag | 5 | 7 |
| Third Layer | ITO | 80 | 80 |
| Fourth Layer | Ag | 5 | 7 |
| Fifth Layer | ITO | 80 | 80 |
| Sixth Layer | Ag | 5 | 7 |
| Seventh Layer | ITO | 30 | 30 |

Thus, an alternating laminated film (referring to FIG. 9) consisting of seven layered ITO and Ag layers was formed on the substrate whereby a transparent electrode was prepared, which had surface resistivity of 2 Ω/□.

(2) Preparation of Semiconductor Layer of Metal Oxide

A titanium oxide thin layer was formed on the resultant glass plate provided with laminated electrode using an opposed target type diode sputtering device: Two sheets of metal titanium targets having size of 100 mm×400 mm were placed above the glass plate, oxygen gas of 5 cc/min. and Ar gas of 5 cc/min. were introduced into the device to adjust pressure within the device to 5 mTorr, and then the sputtering was carried out at supply electric power of 10 kW for 60 minutes to form a titanium oxide layer having the thickness of 3,000 Å.

(3) Adsorption of Spectral Sensitizing Dye

A spectral sensitizing dye represented by di(thiocyanato)-N-(2,2'-bipyridyl-4,4'-dicarboxylic acid)-N'-{2,2'-bipyridyl-4,4'-dicarboxylic acid-bis(tetrabutylammonium)}-ruthenium(II) was dissolved in ethanol to form a solution of the dye having concentration of 3×10$^{-4}$ mol/l. Subsequently, the above glass plate provided with titanium oxide layer was dipped in the dye ethanol solution and allowed to stand for 18 hours whereby a semiconductor electrode of metal oxide of the invention was obtained. The adsorption amount of the dye was 10 μg based on the surface area of titanium oxide layer of 1 cm$^2$.

(4) Preparation of Solar Cell

The resultant semiconductor electrode of metal oxide was used as one electrode of the solar cell, while a glass plate where fluorine-doped tin oxide was coated and further platinum was provided thereon was used as an electrode coupler. An electrolyte was injected between the electrode and the electrode coupler to form a laminate, and the side of the laminate was sealed by resin, and then lead wire was attached to it to form a solar cell of the invention. As the electrolyte, a 0.1 mol/l solution of lithium iodide in acetonitrile, a 0.3 mol/l solution of 1,2-dimethyl-3-propylimidazolium iodide in acetonitrile, a 0.05 mol/l solution of iodine in acetonitrile, and a 0.5 mol/l solution of t-butylpyridine in acetonitrile were used.

The solar cell was exposed to light having intensity of 100 W/cm$^2$ by a solar simulator. As a result, Voc (voltage in open-circuit) was 0.61V, Joc (electric current density caused in short of circuit) was 1.42 mA/cm$^2$, FF (curve factor) was 0.59, and ρ (conversion efficiency) was 5.10%. Hence, it was proved that the solar cell was useful.

Example 13

The procedure of Example 12 was repeated except for using a glass palte of size of 30 cm×30 cm to prepare a solar cell.

The resultant solar cell was exposed to light having intensity of 100 W/cm$^2$ by a solar simulator. As a result, Voc (voltage in open-circuit) was 0.63V, Joc (electric current density caused in short of circuit) was 1.45 mA/cm$^2$, FF (curve factor) was 0.56, and ρ (conversion efficiency) was 5.12%. Hence, it was proved that the solar cell was useful.

Comparison Example 8

The procedure of Example 12 was repeated except for carrying out the preparation of transparent electrode (i.e., transparent electrode having no laminated film) as described below to prepare a solar cell:

(1) Preparation of Transparent Electrode

The transparent electrode was prepared using a magnetron sputtering device as follows:

Sputtering was carried out on a glass plate (thickness: 2 mm) of a size of 5 cm×5 cm using a ceramic target of ITO (Indium-tin oxide) having 100 mm×400 mm under the conditions of pressure within the device of 5 mTorr set by flowing Ar gas of 50 cc/min. and oxygen gas of 3 cc/min. and supply electric power of 2,000 W, which had surface resistivity of 10 Ω/□.

The resultant solar cell was exposed to light having intensity of 100 W/cm$^2$ by a solar simulator. As a result, Voc (voltage in open-circuit) was 0.60V, Joc (electric current density caused in short of circuit) was 1.20 mA/cm$^2$, FF (curve factor) was 0.67, and ρ (conversion efficiency) was 4.80%. Hence, it was not proved that the solar cell was useful because the conversion efficiency is reduced compared with those of Examples.

Comparison Example 9

The procedure of Comparison Example 12 was repeated except for using a glass plate of size of 30 cm×30 cm to prepare a solar cell.

The resultant solar cell was exposed to light having intensity of 100 W/cm$^2$ by a solar simulator. As a result, Voc (voltage in open-circuit) was 0.76V, Joc (electric current density caused in short of circuit) was 0.95 mA/cm$^2$, FF (curve factor) was 0.60, and ρ (conversion efficiency) was 4.30%. Hence, it was not proved that the solar cell was useful because the conversion efficiency was considerably reduced compared with those of Examples 12 and 13.

As apparent from Examples 12 and 13 and Comparison Examples 8 and 9, the solar cell of Example 12 has reduced resistivity because the transparent electrode comprises the laminated film of the invention, and further even the solar cell of Example 13 having increased area scarcely reduced photoelectric conversion. In contrast, the solar cell of Comparison Example 9 having the ITO film as the transparent electrode greatly reduced photoelectric conversion because of increased area.

Example 14

Provision of Antireflection Layer (1) Preparation of Antireflection Layer

A coating liquid prepared by dispersing ITO fine powder having refractive index of 1.7 in ultraviolet-curable acrylic resin was applied onto one side of a glass plate (thickness: 2 mm) of a size of 5 cm×5 cm to form a coating (ITO content; 84 wt. %) having dried thickness of 100 nm, and the coating was exposed ultraviolet rays (300 mJ/cm$^2$) in an atmosphere of nitrogen to be cured. Subsequently, a coating liquid prepared by dispersing silicon oxide fine powder having refractive index of 1.5 in ultraviolet-curable acrylic resin was applied onto the cured layer of ITO to form a coating (silicon oxide content; 40 wt. %) having dried thickness of 100 nm, and the coating was exposed ultraviolet rays (300 mJ/cm$^2$) in an atmosphere of nitrogen to be cured. Thus a two-layered antireflection layer was formed (referring to FIG. 11).

(2) Preparation of Transparent Electrode

The transparent electrode was prepared using a sputtering device as follows:

Sputtering was carried out on the other side of the glass plate using a ceramic target of ITO (Indium-tin oxide) having 100 mm φ for five minutes under the conditions of pressure within the device of 5 mTorr set by flowing Ar gas of 10 cc/min. and oxygen gas of 1.5 cc/min. and supply electric power of 500 W. Thus the ITO layer having the thickness of 3,000 Å was formed on the glass plate.

(3) Preparation of Semiconductor Layer of Metal Oxide

A titanium oxide thin layer was formed on the resultant glass plate provided with ITO transparent electrode using an opposed target type diode sputtering device: Two sheets of metal titanium targets having diameter of 100 mm were placed above the transparent electrode of the glass plate, oxygen gas of 5 cc/min. and Ar gas of 5 cc/min. were introduced into the device to adjust pressure within the device to 5 mTorr, and then the sputtering was carried out at supply electric power of 3 kW for 60 minutes to form a titanium oxide layer having the thickness of 3,000 Å.

(4) Adsorption of Spectral Sensitizing Dye

A spectral sensitizing dye represented by di(thiocyanato)-N-(2,2'-bipyridyl-4,4'-dicarboxylic acid)-N'-{2,2'-bipyridyl-4,4'-dicarboxylic acid-bis(tetrabutylammonium)}-ruthenium(II) was dissolved in ethanol to form a solution of the dye having concentration of 3×10$^{-4}$ mol/l. Subsequently, the above glass plate provided with titanium oxide layer was dipped in the dye ethanol solution and allowed to stand for 18 hours whereby a semiconductor electrode of metal oxide of the invention was obtained. The adsorption amount of the dye was 10 μg based on the surface area of titanium oxide, layer of 1 cm$^2$.

(5) Preparation of Solar Cell

The resultant semiconductor electrode of metal oxide was used as one electrode of the solar cell, while a glass plate where fluorine-doped tin oxide was coated and further platinum was provided thereon was used as an electrode coupler. An electrolyte was injected between the electrode and the electrode coupler to form a laminate, and the side of the laminate was sealed by resin and then lead wire was attached to it to form a solar cell of the invention. As the electrolyte, a 0.1 mol/l solution of lithium iodide in acetonitrile, a 0.3 mol/l solution of 1,2-dimethyl-3-propylimidazolium iodide in acetonitrile, a 0.05 mol/l solution of iodine in acetonitrile, and a 0.5 mol/l solution of t-butylpyridine in acetonitrile were used.

The solar cell was exposed to light having intensity of 100 W/cm$^2$ by a solar simulator. As a result, Voc (voltage in open-circuit) was 0.58V, Joc (electric current density caused in short of circuit) was 1.30 mA/cm$^2$, FF (curve factor) was 0.53, and ρ (conversion efficiency) was 4.01%. Hence, it was proved that the solar cell was useful.

Example 15

The procedure of Example 14 was repeated except for carrying out the preparation of antireflection layer in the following manner to prepare a solar cell using a magnetron sputtering device:

(1) Preparation of Antireflection Layer

An antireflection layer (laminated film of four layers) was formed on one side of a glass plate (thickness: 2 mm) of a size of 5 cm×5 cm in the following manner. The glass plate was placed in the magnetron sputtering device, and subsequently a first layer of titanium oxide thin layer (thickness: 15 nm) was formed by using titanium oxide target, a second layer of silicon oxide thin layer (30 nm) by using silicon oxide target, a third layer of titanium oxide thin layer (100 nm) by using titanium oxide target, and a forth layer of silicon oxide thin layer (100 nm) by using silicon oxide target (referring to FIG. 10).

The resultant solar cell was exposed to light having intensity of 100 W/cm$^2$ by a solar simulator. As a result, Voc (voltage in open-circuit) was 0.59V, Joc (electric current density caused in short of circuit) was 1.31 mA/cm$^2$, FF (curve factor) was 0.53, and ρ (conversion efficiency) was 4.12%. Hence, it was proved that the solar cell was useful.

Comparison Example 10

The procedure of Example 14 was repeated except for not forming the antireflection layer to prepare a solar cell as follows:

The resultant solar cell was exposed to light having intensity of 100 W/cm$^2$ by a solar simulator. As a result, Voc (voltage in open-circuit) was 0.62V, Joc (electric current density caused in short of circuit) was 1.00 mA/cm$^2$, FF (curve factor) was 0.56, and ρ (conversion efficiency) was 3.50%. Hence, it was not proved that the solar cell was useful compared with those of Examples 14 and 15.

As is apparent from Examples 14, 15 and Comparison Example 10, the solar cells of the Examples showed conversion efficiency because their transparent electrode was the substrate provided with antireflection layer.

EFFECT OF THE INVENTION

As is apparent above, the solar cell having the semiconductor electrode of organic sensitized metal oxide according to the invention is provided with the semiconductor layer of metal oxide which can be easily formed at reduced temperature, and further has sufficient performance suitable for a solar cell. In more detail, the organic dye-sensitized solar cell of the invention has especially excellent dye-adsorption property, enhanced photo energy conversion efficiency and long usable life.

Particularly, in case the opposed target type-sputtering device or the bipolar type dual magnetron sputtering device is used for formation of the semiconductor layer of metal oxide, the semiconductor layer of metal oxide, especially anatase-form titanium oxide thin layer, can be further easily formed at reduced temperature. Hence, the operation for the preparation of the semiconductor layer does not do damage to the transparent electrode provided on the glass plate and therefore the solar cell having the semiconductor electrode of organic sensitized metal oxide can be advantageously obtained.

Further, in case the layer including the metal layer having a number of holes or the laminated film comprising a metal compound layer and a metal layer superposed alternately is used as the transparent electrode, the resultant organic dye-sensitized solar cell has the feature that the cell can be easily prepared at reduced temperature and further has sufficient performance suitable for a solar cell having large area. Especially, the solar cell of the invention exhibits excellent photoelectric conversion efficiency even in the large area.

Furthermore, in case the antireflection layer is provided on the substrate, the resultant organic dye-sensitized solar cell can utilize efficiently a solar energy, and therefore has sufficient performance suitable for a solar cell having large area. Particularly, the solar cell of the invention exhibits excellent photoelectric conversion efficiency even in the large area.

DESCRIPTION OF REFERENCE NUMBER 1 substrate
2 transparent electrode
3 semiconductor layer of metal oxide having a spectral sensitizing dye adsorbed thereon
4 electrode coupler
5 sealing agent
6 electrolyte
21a, 21b, 31a, 31b target electrode
22a, 22b, 32a, 32b magnet
23, 33 substrate
H1, H2, H11 high refractive index layer
L1, L2, L11 low refractive index layer
S substrate
MO1, MO2, MO3, MO4 metal compound layer
M1, M2, M3 metal layer
2M, 42M metal film
2P, 42P hole
47 adhesive layer

What is claimed is:

1. A semiconductor electrode of organic dye-sensitized metal oxide comprising a substrate having a transparent electrode thereon, a semiconductor layer of metal oxide provided on the electrode and an organic dye absorbed on a surface of the semiconductor layer, wherein the semiconductor layer is formed by an opposite target type diode sputtering process or a dual cathode type magnetron sputtering process, and the transparent electrode includes a laminated layer comprising a metal compound layer and a metal layer which are superposed alternatively.

2. A semiconductor electrode of organic dye-sensitized metal oxide as defined in claim 1, wherein the sputtering process is a reactive sputtering process.

3. A semiconductor electrode of organic dye-sensitized metal oxide as defined in claim 1 or 2, wherein the dual cathode type magnetron sputtering process is a bipolar type dual magnetron sputtering process or a unipolar type dual magnetron sputtering process.

4. A semiconductor electrode of organic dye-sensitized metal oxide as defined in claim 1 or 2, wherein the semiconductor layer of metal oxide comprises at least one compound selected from titanium oxide, zinc oxide, tin oxide, antimony oxide, niobium oxide, tungsten oxide or indium oxide, or the metal oxide doped by other metal or metal oxide.

5. A semiconductor electrode of organic dye-sensitized metal oxide as defined in claim 1 or 2, wherein the semiconductor layer of metal oxide comprises titanium oxide.

6. A semiconductor electrode of organic dye-sensitized metal oxide as defined in claim 1 or 2, wherein the semiconductor layer of metal oxide comprises anatase-form titanium oxide.

7. A semiconductor electrode of organic dye-sensitized metal oxide as defined claim 1 or 2, wherein a thickness of the semiconductor layer of metal oxide is not less than 10 nm.

8. A semiconductor electrode of organic dye-sensitized metal oxide as defined in claim 1 or 2, wherein the semiconductor layer has surface roughness Ra of not less than 2 nm, the Ra being defined as centerline average height, and void volume of not less than 25%.

9. A semiconductor electrode of organic dye-sensitized metal oxide as defined in claim 1 or 2, wherein the transparent electrode includes a metal layer having a number of holes.

10. A semiconductor electrode of organic dye-sensitized metal oxide as defined in claim 1 or 2, wherein an antireflective layer is provided on a surface having no transparent electrode of the substrate.

11. An organic dye-sensitized solar cell comprising the semiconductor electrode of organic dye-sensitized metal oxide as defined in claim 1 or 2, an electrode couple provided opposite the semiconductor electrode, and redox electrolyte injected between the electrode and the electrode couple.

12. A process for the preparation of a semiconductor electrode of organic dye-sensitized metal oxide comprising the steps of:
    subjecting a transparent electrode of a substrate having the transparent electrode thereon to an opposite target type diode sputtering process or a dual cathode type magnetron sputtering process using a metal and/or metal oxide as a target to form a semiconductor layer of metal oxide, and
    adsorbing an organic dye on a surface of the semiconductor layer.

13. A process as defined in claim 12, wherein the sputtering process is a reactive sputtering process.

14. A process as defined in claim 12 or 13, wherein the dual cathode type magnetron sputtering process is a bipolar type dual magnetron sputtering process or a unipolar type dual magnetron sputtering process.

15. A process as defined in claim 12 or 13, wherein the metal as the target is titanium, zinc, tin, antimony, niobium, tungsten or indium, or a mixture of the metals, and the metal oxide as the target is titanium oxide, zinc oxide, tin oxide, antimony oxide, niobium oxide, tungsten oxide or indium oxide, or the metal oxide doped by other metal or metal oxide.

16. A process as defined in claim 12 or 13, wherein the semiconductor layer of metal oxide comprises at least one compound selected from titanium oxide, zinc oxide, tin oxide, antimony oxide, niobium oxide, tungsten oxide or indium oxide, or the metal oxide doped by other metal or metal oxide.

17. A process as defined in claim 12 or 13, wherein the semiconductor layer of metal oxide comprises titanium oxide.

18. A process as defined in claim 12 or 13, wherein the semiconductor layer of metal oxide comprises anatase-form titanium oxide.

19. A process as defined in claim 12 or 13, wherein a thickness of the semiconductor layer of metal oxide is not less than 10 nm.

* * * * *